(12) United States Patent
Enquist

(10) Patent No.: US 6,984,571 B1
(45) Date of Patent: Jan. 10, 2006

(54) THREE DIMENSIONAL DEVICE INTEGRATION METHOD AND INTEGRATED DEVICE

(75) Inventor: Paul M. Enquist, Cary, NC (US)

(73) Assignee: Ziptronix, Inc., Research Triangle Park, NC (US)

( * ) Notice: Subject to any disclaimer, the term of this patent is extended or adjusted under 35 U.S.C. 154(b) by 0 days.

(21) Appl. No.: 09/410,054

(22) Filed: Oct. 1, 1999

(51) Int. Cl.
*H01L 29/06* (2006.01)

(52) U.S. Cl. .................. 438/459; 438/977; 438/107; 156/155; 156/182; 148/DIG. 12

(58) Field of Classification Search ................ 438/459, 438/977, 404, 406, 107, FOR 485
See application file for complete search history.

(56) References Cited

U.S. PATENT DOCUMENTS

| | | |
|---|---|---|
| 3,423,823 A | 1/1969 | Ansley |
| 3,488,834 A | 1/1970 | Baird |
| 3,508,980 A | 4/1970 | Jackson, Jr. et al. |
| 3,534,467 A | 10/1970 | Sachs et al. |
| 3,579,391 A | 5/1971 | Buie |
| 3,587,166 A | 6/1971 | Alexander |
| 3,602,981 A | 9/1971 | Kool |
| 3,607,466 A | 9/1971 | Miyazaki |
| 3,640,807 A | 2/1972 | Van Dijk |
| 3,647,581 A | 3/1972 | Mash |
| 3,888,708 A | 6/1975 | Wise et al. |
| 4,416,054 A | 11/1983 | Thomas et al. |
| 4,612,083 A | 9/1986 | Yasumoto et al. |
| 4,617,160 A | 10/1986 | Belanger et al. |
| 4,649,630 A | 3/1987 | Boland et al. |
| 4,754,544 A | 7/1988 | Hanak |
| 4,829,018 A | 5/1989 | Wahlstrom |
| 4,962,879 A | 10/1990 | Goesele et al. |
| 4,963,505 A | 10/1990 | Fujii et al. |
| 4,970,175 A | 11/1990 | Haisma et al. |
| 4,978,421 A | 12/1990 | Bassous et al. |
| 4,983,251 A | 1/1991 | Haisma et al. |
| 5,024,723 A | 6/1991 | Goesele et al. |

(Continued)

FOREIGN PATENT DOCUMENTS

| | | |
|---|---|---|
| EP | 0209173 A | 1/1987 |

(Continued)

OTHER PUBLICATIONS

Haisma, J., et al., "Silicon-on-Insulator Wafer Bonding-Wafer Thinning Technological Evaluations", Jap.Journal-.Appl.Phys., vol. 28, No. 8 (1989), pp. 1426-1443.*

(Continued)

*Primary Examiner*—George Fourson
(74) *Attorney, Agent, or Firm*—Oblon, Spivak, McClelland, Maier & Neustadt, P.C.

(57) ABSTRACT

A device integration method and integrated device. The method includes the steps of polishing surfaces of first and second workpieces each to a surface roughness of about 5–10 Å. The polished surfaces of the first and second workpieces are bonded together. A surface of a third workpiece is polished to the surface roughness. The surface of the third workpiece is bonded to the joined first and second workpieces. The first, second and third workpieces may each be a semiconductor device having a thin material formed on one surface, preferably in wafer form. The thin materials are polished to the desired surface roughness and then bonded together. The thin materials may each have a thickness of approximately 1–10 times the surface non-planarity of the material on which they are formed. Any number of devices may be bonded together, and the devices may be different types of devices or different technologies.

80 Claims, 7 Drawing Sheets

U.S. PATENT DOCUMENTS

| | | |
|---|---|---|
| 5,034,343 A | 7/1991 | Rouse et al. |
| 5,070,026 A | 12/1991 | Greenwald et al. |
| 5,071,792 A | 12/1991 | Van Vonno et al. |
| 5,081,061 A | 1/1992 | Rouse et al. |
| 5,087,585 A * | 2/1992 | Hayashi ............... 438/155 |
| 5,089,431 A * | 2/1992 | Slatter et al. ............. 438/193 |
| 5,121,706 A | 6/1992 | Nichols et al. |
| 5,162,251 A | 11/1992 | Poole et al. |
| 5,183,783 A | 2/1993 | Ohta et al. |
| 5,196,375 A | 3/1993 | Hoshi |
| 5,266,511 A * | 11/1993 | Takao .................. 438/401 |
| 5,270,261 A | 12/1993 | Bertin et al. |
| 5,272,104 A | 12/1993 | Schrantz et al. |
| 5,321,301 A | 6/1994 | Sato et al. |
| 5,324,687 A | 6/1994 | Wojnarowski |
| 5,354,695 A | 10/1994 | Leedy |
| 5,362,659 A | 11/1994 | Cartagena |
| 5,376,579 A | 12/1994 | Annamalai |
| 5,380,681 A | 1/1995 | Hsu |
| 5,407,856 A | 4/1995 | Quenzer et al. |
| 5,421,953 A | 6/1995 | Nagakubo et al. |
| 5,427,638 A | 6/1995 | Goetz et al. |
| 5,432,729 A | 7/1995 | Carson et al. |
| 5,441,591 A | 8/1995 | Imthurn et al. |
| 5,441,911 A | 8/1995 | Malhi |
| 5,459,104 A * | 10/1995 | Sakai .................. 438/406 |
| 5,460,659 A | 10/1995 | Krut |
| 5,485,540 A | 1/1996 | Eda |
| 5,489,554 A | 2/1996 | Gates |
| 5,497,033 A | 3/1996 | Filion et al. |
| 5,503,704 A | 4/1996 | Bower et al. |
| 5,514,235 A | 5/1996 | Mitani et al. |
| 5,516,727 A | 5/1996 | Broom |
| 5,517,754 A | 5/1996 | Beilstein, Jr. et al. |
| 5,534,465 A | 7/1996 | Frye et al. |
| 5,546,494 A | 8/1996 | Eda |
| 5,548,178 A | 8/1996 | Eda et al. |
| 5,561,303 A | 10/1996 | Schrantz et al. |
| 5,563,084 A | 10/1996 | Ramm et al. |
| 5,567,657 A | 10/1996 | Wojnarowski et al. |
| 5,569,620 A | 10/1996 | Linn et al. |
| 5,580,407 A | 12/1996 | Haisma et al. |
| 5,591,678 A | 1/1997 | Bendik et al. |
| 5,647,932 A | 7/1997 | Taguchi et al. |
| 5,650,353 A | 7/1997 | Yoshizawa et al. |
| 5,652,436 A | 7/1997 | Stoner et al. |
| 5,653,019 A | 8/1997 | Bernhardt et al. |
| 5,661,316 A | 8/1997 | Kish, Jr. et al. |
| 5,661,901 A | 9/1997 | King |
| 5,666,706 A | 9/1997 | Tomita et al. |
| 5,668,057 A | 9/1997 | Eda et al. |
| 5,672,240 A | 9/1997 | Stoner et al. |
| 5,673,478 A | 10/1997 | Beene et al. |
| 5,698,471 A | 12/1997 | Namba et al. |
| 5,741,733 A * | 4/1998 | Bertagnolli et al. ........ 438/152 |
| 5,747,857 A | 5/1998 | Eda et al. |
| 5,755,914 A | 5/1998 | Yonehara |
| 5,759,753 A | 6/1998 | Namba et al. |
| 5,760,478 A | 6/1998 | Bozso et al. |
| 5,763,318 A | 6/1998 | Bertin et al. |
| 5,766,984 A * | 6/1998 | Ramm et al. ............. 438/109 |
| 5,771,555 A | 6/1998 | Eda et al. |
| 5,783,477 A | 7/1998 | Kish, Jr. et al. |
| 5,785,874 A | 7/1998 | Eda et al. |
| 5,793,115 A | 8/1998 | Zavracky et al. |
| 5,804,086 A | 9/1998 | Bruel |
| 5,821,665 A | 10/1998 | Onishi et al. |
| 5,841,197 A | 11/1998 | Adamic, Jr. |
| 5,849,627 A | 12/1998 | Linn et al. |
| 5,851,894 A | 12/1998 | Ramm |
| 5,866,942 A | 2/1999 | Suzuki et al. |
| 5,869,354 A | 2/1999 | Leedy |
| 5,872,025 A | 2/1999 | Cronin et al. |
| 5,877,034 A | 3/1999 | Ramm et al. |
| 5,877,070 A | 3/1999 | Goesele et al. |
| 5,877,516 A | 3/1999 | Mermagen et al. |
| 5,880,010 A | 3/1999 | Davidson |
| 5,902,118 A * | 5/1999 | Hubner .................. 438/106 |
| 5,903,018 A | 5/1999 | Shimawaki |
| 5,904,860 A | 5/1999 | Nagakubo et al. |
| 5,910,699 A | 6/1999 | Namba et al. |
| 5,915,167 A | 6/1999 | Leedy |
| 5,915,193 A | 6/1999 | Tong et al. |
| 5,920,142 A | 7/1999 | Onishi et al. |
| 5,936,280 A | 8/1999 | Liu |
| 5,966,622 A | 10/1999 | Levine et al. |
| 5,982,010 A | 11/1999 | Namba et al. |
| 5,990,472 A | 11/1999 | Rinne |
| 5,991,989 A | 11/1999 | Onishi et al. |
| 6,004,866 A * | 12/1999 | Nakano et al. ............ 438/459 |
| 6,018,211 A | 1/2000 | Kanaboshi et al. |
| 6,048,752 A | 4/2000 | Linderman |
| 6,071,761 A | 6/2000 | Jacobs |
| 6,087,760 A | 7/2000 | Yamaguchi et al. |
| 6,103,009 A | 8/2000 | Atoji |
| 6,120,917 A | 9/2000 | Eda |
| 6,133,640 A | 10/2000 | Leedy |
| 6,143,628 A | 11/2000 | Sato et al. |
| 6,146,992 A * | 11/2000 | Lauterbach et al. ........ 438/623 |
| 6,153,445 A | 11/2000 | Yamazaki et al. |
| 6,153,495 A | 11/2000 | Kub et al. |
| 6,154,940 A | 12/2000 | Onishi et al. |
| 6,156,624 A | 12/2000 | Yamagata et al. |
| 6,165,817 A | 12/2000 | Akram et al. |
| 6,180,496 B1 | 1/2001 | Farrens et al. |
| 6,190,778 B1 | 2/2001 | Batz-Sohn et al. |
| 6,197,663 B1 | 3/2001 | Chandross et al. |
| 6,198,159 B1 | 3/2001 | Hosoma et al. |
| 6,236,141 B1 | 5/2001 | Sato et al. |
| 6,246,068 B1 | 6/2001 | Sato et al. |
| 6,255,731 B1 | 7/2001 | Ohmi et al. |
| 6,255,899 B1 | 7/2001 | Bertin et al. |
| 6,270,202 B1 | 8/2001 | Namba et al. |
| 6,274,892 B1 | 8/2001 | Kub et al. |
| 6,323,108 B1 | 11/2001 | Kub et al. |
| 6,448,174 B1 * | 9/2002 | Ramm .................. 438/637 |
| 6,562,647 B2 | 5/2003 | Zandman et al. |

FOREIGN PATENT DOCUMENTS

| | | |
|---|---|---|
| EP | 1130647 A | 9/2001 |
| JP | 54116888 A | 9/1979 |
| JP | 54155770 A | 12/1979 |
| JP | 62031138 A | 2/1987 |
| JP | 63237408 A | 10/1988 |
| JP | 63246841 A | 10/1988 |
| JP | 01259546 A | 10/1989 |
| JP | 02177435 A | 7/1990 |
| JP | 03070155 A | 3/1991 |
| JP | 03101128 A | 4/1991 |
| JP | 60167439 A | 8/1995 |
| WO | WO 9613060 A | 5/1996 |
| WO | WO 9845130 A | 10/1998 |
| WO | WO 0126137 A | 4/2001 |
| WO | WO 0161743 A | 8/2001 |

OTHER PUBLICATIONS

Bruel, M., et al., "Smart Cut: A Promising New SOI Material Technology", Proceedings 1995 IEEE Int'l SOI Conference, Oct. 1995, pp. 178-179.*

Tong, Qin-Yi, et al, "Low Temperature Wafer Direct Bonding", IEEE 1994, Journal of Microelectomechanical Systems, vol. 3, No. 1, Mar. 1994, pp. 29-35.*

Gosele, U., et al, "Semiconductor Wafer Bonding, A Flexible Approach to Materials Combinations in Microelectronics, Micromechanics and Optoelectronics", 1997 IEEE, pp. 23-32.*

Takagi, Hideki, et al, "Low Temperature Direct Bonding of Silicon and Silicon Dioxide by the Surface Activation Method", Transducers 1997, 1997 Int. Conf. on Solid State Sensors and Actuators Jun. 16-19, 1997, pp. 657-660.*

Studies of SiO2-SiO2 Bonding with Hydrofluoric Acid—Room Temperature and Low Stress Bonding Technique for Mems, 1998 IEEE, pp. 609-614.*

International Preliminary Examining Authority, "Written Opinion", Aug. 20, 2001.

"Fabrication of Planar Arrays of Semiconductor Chips Separated by Insulting Barriers", IBM Technical Disclosure Bulletin, Apr. 1965, p. 1103.

"Cool Plasma Activated Surface in Silicon Wafer Direct Bonding Technology"; Sun et al.; Journal de Physique, pp. C4-79 to C4-82, Sep. 1988.

"Generalized Reactive Bonding"; Goetz; Proceedings of the 1st Semiconductor Wafer Bonding Symposium, pp. 65-73, 1991.

"Application of Oxygen Plasma Processing to Silicon Direct Bonding"; Zucker et al.; Sensors and Actuators A, 36; pp. 227-231, 1993.

"Chemical Free Room Temperature Wafer to Wafer Direct Bonding"; Farrens et al.; J. Electrochem Soc., vol. 142, No. 11; pp. 3949-3955; Nov. 1995.

"Formation of Silicon Structures by Plasma Activated Wafer Bonding"; Amirfeiz et al.; Proceedings of the 5th Semiconductor Wafer Bonding Symposium; 11 pages; Oct. 1999.

"Studies on SiO2-SiO2 Bonding with Hydrofluoric Acid—Room Temperature and Low Stress Bonding Technique for Mems"; Nakanishi et al., IEEE; pp. 609-614; 1998.

"A Double-Side IGBT by Low Temperature Wafer Bonding"; F.J. Kub et al.; The 1999 Joint International Meeting, vol. 99-2, Abstract No. 1031, 1 page, Oct. 1999.

"Low Temperature Bonding"; S. Bengtsson et al.; International Conference on Compliant & Alternative Substrate Technology, p. 10, Sep. 1999.

"Low Temperature Wafer Bonding"; S. Farrens; Electromechanical Society Proceedings, vol. 97-36, pp. 425-436, 1997.

"Silicon Wafer Direct Bonding Through the Amorphous Layer"; S. Fujino et al.; Japanese Journal Appl. Phys., vol. 34, No. 10B, 1 page, Oct. 15, 1995.

"Self-Propagating Room-Temperature Silicon Wafer Bonding in Ultrahigh Vacuum"; U. Gösele et al.; Appl. Phys. Lett., vol. 67, No. 24, pp. 3614-3616; Dec. 11, 1995.

"Evolution of Subsurfaces Hydrogen From Boron-Doped Si(100)"; G. Hess et al.; Appl. Phys. Lett., vol. 71, No. 15; pp. 2184-2186; Oct. 13, 1997.

"Characterization of Si pn Junctions Fabricated by Direct Wafer Bonding in Ultra-High Vacuum"; K.D. Hobart et al.; Applied Physics Letters, vol. 72, No. 9; pp. 1095-1097; Mar. 2, 1998.

"Effects of B Doping on Hydrogen Desorption from Si(001) During Gas-Source Molecular-Beam Epitaxy from Si2H6 and B2H6"; H. Kim et al.; Appl. Phys. Lett., vol. 69, No. 25; pp. 3869-3871; Dec. 16, 1996.

"Covalent Silicon Bonding at Room Temperature in Ultrahigh Vacuum"; A. Plössl et al.; Mat. Res. Soc. Symp. Proc., vol. 483; pp. 141-146; 1998.

"Wafer Bonding of GaAS, InP, and Si Annealed without Hydrogen for Advanced Device Technologies"; B.E. Roberds et al.; Electromechanical Society Proceedings, vol. 97-36, pp. 592-597; 1997.

"Low Temperature, in situ, Plasma Activated Wafer Bonding"; B.E. Roberds et al.; Electromechanical Society Proceedings, vol. 97-36, pp. 598-606; 1997.

"Surface Activated Bonding of Silicon Wafers at Room Temperature"; H. Takagi et al.; Appl. Phys. Lett., vol. 68, No. 16, pp. 2222-2224; Apr. 15, 1996.

"Hydrophobic Silicon Wafer Bonding"; Qin-Yi Tong et al.; Appl. Phys. Lett.; vol. 64, No. 5, pp. 625-627; Jan. 31, 1994.

"Room Temperature Silicon and SiO2 Bonding in Ambient"; Qin-Yi Tong; 9 pages; Dec. 10, 1999.

"Transmission Electron Microscope Observations of Si/Si Interface Bonded at Room Temperature by Ar Beam Surface Activation"; H. Takagi et al; Jpn. J. Appl. Phys., vol. 38, No. 3A, pp. 1589-1594; Mar. 1999.

"GaAs Wafer Bonding by Atomic Hydrogen Surface Cleaning"; T. Akatsu et al.; Journal of Applied Physics, vol. 86, No. 12, pp. 7146-7150; Dec. 15, 1999.

"A Study of Glass Surfaces in Optical Contact"; L. Rayleigh; Proceedings of the Royal Society of London, Series A—Mathematical and Physical Sciences, vol. 156, pp. 326-349, Sep. 1, 1936.

"Mechanistic Studies of Silicon Wafer Bonding and Layer Exfoliation"; M.K. Weldon et al.; Proceedings of the Fourth International Symposium on Semiconductor Wafer Bonding: Science, Technology and Applications, Proceedings vol. 97-36, pp. 229-248; no date.

"Investigation of Bonded Silicon-Silicon-Interfaces Using Scanning Acoustic Microscopy"; S. Schulze et al.; Proceedings of the Second International Symposium on Microstructures Systems, Proceedings vol. 95-27, pp. 309-318; no date.

"IOS—A New Type of Materials Combination for System-On-A Chip Preparation"; Qin-Yi Tong et al.; 1999 IEEE International SOI Conference; pp. 104-105; Oct. 1999.

"The Mechanism of Field-Assisted Silicon-Glass Bonding"; Yozo Kanda et al.; Sensors and Actuators, vol. A21-A23, pp. 939-943, 1990.

"Low-Temperature Silicon Direct Bonding and Interface Behaviours"; Jiwei Jiao et al.; Sensors and Actuators, vol. A50, pp. 117-120, 1995.

"Wafer-to-Wafer Fusion Bonding of Oxidized Silicon to Silicon at Low Temperatures"; A. Berthold et al.; Sensors and Actuators, vol. A68, pp. 410-413, 1998.

"Low Vacuum Wafer Bonding"; Qin-Yi Tong et al.; Electromechanical and Solid-State Letters, vol. 1, No. 1, pp. 52-53, 1998.

"Void-Free Silicon-Wafer-Bond Strengthening in the 200-400° C. Range"; Gudrun Kissinger et al.; Sensors and Actuators, vol. A36, pp. 149-156, 1993.

"Reactive Ion-Etching-Induced Damage in Silicon Using SF6 Gas Mixture"; B.M. Arora et al.; J. Vac. Sci. Technol., vol. B5, No. 4; pp. 876-882, Jul./Aug. 1987.

"Fusing Silicon Wafers with Low Melting Temperature Glass"; Leslie A. Field et al.; Sensors and Actuators, vol. A21-A23, pp. 935-938, 1990.

"Room Temperature Wafer Bonding of Silicon Oxidized Silicon, and Crystalline Quartz"; Stefan Bengtsson et al., Journal of Electronic Materials, vol. 29, vol. 7, 2000.

"Oxidation and Induced Damage in Oxygen Plasma In Situ Wafer Bonding"; Donato Pasquariello et al.; Journal of the Electrochemical Society, vol. 147, No. 7, pp. 2699-2703, 2000.

"Mesa-Spacers Enabling Nondestructive Measurement of Surface Energy in Room Temperature Wafer Bonding"; Donato Pasquariello et al.; Journal of Electrochemical Society, vol. 147, No. 6; pp. 2343-2346, 2000.

"Interface Strength Characterization of Bonded Wafers"; M. Petzold et al.; Proceedings of the Third International Symposium on Semiconductor Wafer Bonding: Physics and Applications Proceedings, vol. 95-7, pp. 380-389; no date.

"Characterization of Directly Bonded Silicon Wafers by Means of the Double Cantilever Crack Opening Method"; J. Bagdahn et al.; Proceeding of the Fourth International Symposium on Semiconductor Wafer Bonding: Science, Technology and Applications, Proceedings vol. 97-36, pp. 291-298; no date.

"Wafer Direct Bonding Tailoring Adhesion Between Brittle Materials"; A. Plössl et al.; Materials Science & Engineering, vol. R25, Nos. 1-2, pp. 1-88, Mar. 10, 1999.

"VLSI Interconnects for Ultra High Speed Signal Propagation"; Tadahiro OHMI et al.; Proceedings Fifth International IEEE VLSI Multilevel Interconnection Conference; pp. 261-267; Jun. 13-14, 1988.

"Current Gain Collapse in Microwave Multifinger Heterojunction Bipolar Transistors Operated at Very High Power Densities"; William Liu et al.; IEEE Transactions on Electron Devices, vol. 40, No. 11, pp. 1917-1927, Nov. 1993.

"Beyond "Smart Cut®": Recent Advances in Layer Transfer for Material Integration"; Qin-Yi Tong et al.; MRS Bulletin, pp. 40-44, Dec. 1998.

"Direct Bonding in Patent Literature"; Jan Haisma; Philips Journal of Research, vol. 49, No. 1/2, pp. 165-170; 1995.

"Surface-Related Phenomena in the Direct Bonding of Silicon and Fused-Silica Wafer Pairs"; G.A.C.M. Spierings, et al.; Philips Journal of Research, vol. 49, No. 1/2; pp. 47-63, 1995.

"Double-Cantilever Cleavage Mode of Crack Propagation"; Peter P. Gillis et al.; Journal of Applied Physics, vol. 35, No. 3 (Part I), pp. 647-658, Mar. 1964.

"Fluorine Enhanced Oxidation of Silicon at Low Temperatures"; A. Kazor et al.; Appl. Phys. Lett. vol. 65, No. 12, pp. 1572-1574, Sep. 19, 1994.

"Mobile Fluoride Ions in $SiO_2$"; R. Williams et al.; Journal of Applied Physics, vol. 46, No. 2, pp. 695-698, Feb. 1975.

"Chemistry of Fluorine in the Oxidation of Silicon"; S.R. Kasi et al., Appl. Phys. Lett. vol. 58, No. 25, pp. 2975-2977; Jun. 24, 1991.

"Improvement of Rinsing Efficiency After Sulfuric Acid Hydrogen Peroxide Mixture (H2SO4/H202) By HF Addition"; Rochdi Messoussi et al.; Jpn. J. Appl. Phys., vol. 35, Part I, No. 4A, pp. 1989-1992; 1996.

"Ultraclean Technique for Silicon Wafer Surfaces with HNO3-HF Systems"; Ritsuo Takizawa et al.; Jpn. J. Appl. Phys. vol. 27, No. 11; pp. L2210-L2212; Nov. 1998.

"Bubble-Free Silicon Wafer Bonding in a Non-Cleanroom Environment"; R. Stengl et al.; Jpn. J. Appl. Phys., vol. 29, No. 12, pp. L2311-L2314, Dec. 1988.

"Silicon Wafer Bonding Mechanism for Silicon-On-Insulator Structures"; Takao Abe et al.; Jpn. J. Appl. Phys., Dec. 1990.

"Distribution of Irradiation Damage in Silicon Bombarded with Hydrogen"; W.K. Chu et al.; Physical Review B, vol. 16, No. 9, pp. 3851-3859; Nov. 1, 1977.

"Dielectric Characteristics of Fluorinated Ultradry SiO2"; Yasushiro Nishioka et al.; Appl. Phys. Lett. vol. 54, No. 12, pp. 1127-1129; Mar. 20, 1999.

"Silicon-Fluorine Bonding and Fluorine Profiling in SiO2 Films Grown by NF3-Enhanced Oxidation"; D. Kouvatsos, et al.; Appl. Phys. Lett., vol. 61, No. 7, pp. 780-782; Aug. 17, 1992.

"Hydrogen Blister Depth in Boron and Hydrogen Coimplanted N-type Silicon"; T. Hochbauer et al.; Appl. Phys. Lett. vol. 75, No. 25; pp. 3938-3940; Dec. 20, 1999.

"Layer Splitting Process in Hydrogen-Implanted Si, Ge, SiC, and Diamond Substrates"; Qin-Yi Tong et al.; Appl. Phys. Lett. vol. 70, No. 11, pp. 1390-1392; Mar. 17, 1997.

"Room Temperature Bonding of Lithium Nobate and Silicon Wafers by Argon-Beam Surface Activation"; Hideki Takagi et al.; Appl. Phys. Lett., vol. 74, No. 16; pp. 2387-2389; Apr. 19, 1999.

"Fluorine-Enhanced Thermal Oxidation of Silicon in the Presence of NF3"; M. Morita et al.; Appl. Phys. Lett., vol. 45; No. 12, pp. 1312-1314, Dec. 15, 1984.

"Spontaneous Bonding of Hydrophobic Silicon Surfaces"; Karin Ljungberg et al., Appl. Phys. Lett., vol. 62, No. 12, pp. 1362-1364, Mar. 22, 1993.

"Bistable Conditions for Low-Temperature Silicon Epitaxy"; Bernard S. Meyerson et al.; Appl Phys. Lett. vol. 57, No. 10, pp. 1034-1036, Sep. 3, 1990.

"A Smarter-Cut Approach to Low Temperature Silicon Layer Transfer"; Qin-Yi Tong et al., Appl. Phys. Lett., vol. 72, No. 1, pp. 49-51, Jan. 5, 1998.

"Evidence for Atomic H Insertion into Strained Si-Si Bonds in the Amorphous Hydrogenated Subsurface from In Situ Infrared Spectroscopy"; A. von Keudell et al.; Appl. Phys. Lett. vol. 71, No. 26; pp. 3832-3834, Dec. 29, 1997.

"A Study of the Dissolution of SiO2 in Acidic Fluoride Solutions"; John S. Judge; J. Electrochem. Soc.: Solid State Science, vol. 118, No. 11; pp. 1772-1775, Nov. 1971.

"A Model of Low-Temperature Wafer Bonding and Its Applications"; Qin-Yi Tong et al.; J. Electrochem. Soc., vol. 142, No. 5, pp. 1773-1779; May 1996.

"Analysis of Bonding-Related Gas Enclosure In Micromachined Cavities Sealed by Silicon Wafer Bonding"; S. Mack et al.; J. Electrochem. Soc., vol. 144, No. 3, pp. 1106-1111, Mar. 1997.

"Basic Mechanisms Involved in the Smart-Cut® Process"; B. Aspar et al.; Microelectronic Engineering. vol. 36, pp. 233-240; 1997.

"Surface Roughness of Hydrogen Ion Cut Low Temperature Bonded Thin Film Layers"; Y. Albert Li et al; J. Appl. Phys., vol. 39, Part I, No. 1, pp. 275-276, Jan. 2000.

"Modification of Silicon Surfaces with H2SO4:H2O2:HF and HNO3:HF for Wafer Bonding Applications"; Karin Ljungberg et al.; Electrochemical Society Proceedings, vol. 95-7, pp. 163-173; no date.

"Closure and Repropagation of Healed Cracks in Silicate Glass"; Terry A. Michalske et al.; J. Am. Ceram. Soc., vol. 68, No. 11, pp. 586-590; 1995.

"Microscopic Structure of the Hydrogen-Boron Complex in Crystalline Silicon"; P.J.H. Denteneer et al., Physical Review B, vol. 39, No. 15, pp. 10809-10824; May 15, 1989.

"Hydrogen Description Kinetics From Monohydride and Dihydride Species on Silicon Surfaces"; P. Gupta et al.; Physical Review B, vol. 37, No. 14, pp. 8234-8243; May 15, 1988.

"Donor-Hydrogen Complexes in Passivated Silicon", K. Bergman et al.; Physical Review B, vol. 37, No. 5, pp. 2770-2773; Feb. 15, 1988.

"Characterization of Microvoids in Device-Quality Hydrogenated Amorphous Silicon by Small-Angle X-Ray Scatterin and Infrared Measurements"; A.H. Mahan et al.; Physical Review B, vol. 40, No. 17; pp. 12024-12027; Dec. 15, 1989.

"Morphology of Hydrofluoric Acid and Ammonium Fluoride-Treated Silicon Surfaces Studied by Surface Infrared Spectroscopy"; M. Niwano et al., J. Appl. Phys., vol. 71, No. 11, pp. 5646-5649; Jun. 1, 1992.

"Kinetic Model for Hydrogen Reactions in Boron-Doped Silicon"; Jeffrey T. Borenstein et al., J. Appl. Phys. vol. 73, No. 6, pp. 2751-2754, Mar. 15, 1993.

"Hydrogen Configurations and Stability in Amorphous Sputtered Silicon"; L. Lusson et al.; J. Appl. Phys. vol. 81, No. 7, pp. 3073-3080; Apr. 1, 1997.

"Hydrogen in Crystalline Semiconductors"; S.J. Pearton et al.; Appl. Phys. A, vol. 43, pp. 153-195, 1987.

"Passivation, Structural Modification, and Etching of Amorphous Silicon in Hydrogen Plasmas"; S.A. McQuaid et al.; J. Appl. Phys. vol. 81, No. 11, pp. 7612-7618; Jun. 1, 1997.

"Transferred Substrate Schottky-Collector Heterojunction Bipolar Transistors: First Results and Scaling Laws for High $f$max"; U. Bhattacharya et al.; IEEE Electron Device Letters, vol. 16, No. 8, pp. 357-359; Aug. 1995.

"A 277-GHz $f$max Transferred-Substrate Heterojunction Bipolar Transistor"; B. Agarwal et al.; IEEE Electron Device Letters, vol. 18, No. 5, pp. 228-231; May 1997.

"A > 400 GHz $f$max Transferred-Substrate Heterojunction Bipolar Transistor IC Technology"; Q. Lee et al.; IEEE Electron Device Letters, vol. 19, No. 3, pp. 77-79, Mar. 1998.

"Submicron Transferred-Substrate Heterjunction Bipolar Transistors", Q. Lee et al.; IEEE Electron Device Letters, vol. 20, No. 8; pp. 396-398; Aug. 1999.

"A New Evaluation Method of Silicon Wafer Bonding Interfaces and Bonding Strength by KOH Etching"; Kiyoshi Mitani et al.; Jpn. J. Appl. Phys. vol. 31, Part 1, No. 4; pp. 969-974; Apr. 1992.

"Causes and Prevention of Temperature-Dependent Bubbles in Silicon Wafer Bonding"; Kiyoshi Mitani et al.; Jpn. J. Appl. Phys. vol. 30, No. 4, pp. 615-622; Apr. 1991.

"A Model for the Silicon Wafer Bonding Process"; R. Stengl et al.; Jpn. J. Appl. Phys. vol. 28, No. 10; pp. 1735-1741; Oct. 1989.

"A New Leakage Component Caused by the Interaction of Residual and the Relative Position of Poly-Si Gate at Isolation Edge"; Hyeokjae Lee et al.; IEDM Technical Digest, vol. 95-683; pp. 28.2.1-28.2.4; Dec. 10-13, 1995.

"Diversity and Interfacial Phenomena in Direct Bonding"; G.A.C.M. Spierings et al.; Proceedings of the First International Symposium on Semiconductor Wafer Bonding: Science, Technology, and Applications, Proceedings vol. 92-7, pp. 18-32; no date.

"Over-220-GHz-fr-AND-fmax Inp/InGaAs Double-Heterojunction Bipolar Transistors with a New Hexagonal-Shaped Emitter"; Shoji Yamahata et al.; IEEE Gallium Arsenide Integrated Circuit Symposium, Technical Digest 1995, pp. 163-166; Oct. 29-Nov. 1, 1995.

"An InP-Based HBT FAB for High-Speed Digital, Analog, Mixed-Signal, and Optoelectronic Ics"; W.E. Stanchina et al., IEEE Gallium Arsenide Integrated Circuit Symposium, Technical Digest 1995, pp. 31-34, Oct. 29-Nov. 1, 1995.

"Giga-Bit Dram Cells with Low Capacitance and Low Resistance Bit-Lines on Buries MOSFET's and Capacitors by Using Bonded SOI Technology-Reversed-Stacked-Capacitor (RSTC) Cell"; S. Nakamura et al., IEDM Technical Digest, vol. 95, pp. 889-892; Dec. 10-13, 1995.

"Silicon-on-Insulator (SOI) by Bonding and Etch-Back"; J.B. Lasky et al., IEDM Technical Digest, vol. 85, pp. 684-687; Dec. 1-4, 1985.

"Polymer Bonding of Micro-Machined Silicon Structures"; C.den Besten et al.; IEEE Micro Electro Mechanical Systems, pp. 104-109; Feb. 4-7, 1992.

"Variable-Flow Micro-Valve Structure Fabricated with Silicon Fusion Bonding"; Farzad Pourahmadi et al.; IEEE Solid-State Sensor and Actuator Workshop: Technical Digest, pp. 144-147; Jun. 4-7, 1990.

"Electrical Characterization of Plasma Bonded SOI"; Peter Bjeletich et al.; Proceedings of the Fourth International Symposium on Semiconductor Wafer Bonding: Science, Technology and Applications, Proceedings vol. 97-36; pp. 349-357; no date.

"An Ultra Low-Power RF Bipolar Technology On Glass"; R. Dekker et al., IEDM Technical Digest; vol. 97, pp. 921-923; Dec. 7-10, 1997.

"The Role of Fluorine Termination in the Chemical Stability of HF-Treated Si Surfaces"; Takeshi Sunada et al.; Jpn. J. Appl. Phys., vol. 29, No. 12; Dec. 1990.

"Interaction Between Water and Flourine-Doped Silicon Oxide Films Deposited by Plasma-Enhanced Chemical Vapor Deposition"; M. Yoshimaru et al.; J. Vac. Sci. Technol. A, vol. 15, No. 6, pp. 2915-2922; Nov./Dec. 1997.

"Study of Fluorine in Silicate Glass with 19F Nuclear Magnetic Resonance Spectroscopy"; T.M. Duncan et al.; J. Appl. Phys., vol. 60, No. 1; pp. 130-136; Jul. 1, 1986.

"Retention of Fluorine in Silica Gels and Glass"; Eliezer M. Rabinovich et al.; J. Am. Ceram. Soc., vol. 72, No. 7; pp. 1229-1232; 1989.

"Some Illumination on the Mechanism of SiO2 Etching in HF Solutions"; Henry Nielsen et al.; J. Electrochem. Soc.: Solid-State Science and Technology, vol. 130, No. 3; pp. 708-711; Mar. 1983.

"Low Temperature InP Layer Transfer"; Qin-Yi Tong et al.; Electronics Letters, vol. 35, No. 4; pp. 341-342; Feb. 18, 1999.

"Semiconductor Wafer Bonding: Recent Developments"; Qin-Yi Tong et al.; Materials Chemistry and Physics; vol. 37, pp. 101-127; 1994.

"Bonding of Silicon Wafers for Silicon-On-Insulator"; W.P. Maszara et al.; J. Appl. Phys., vol. 64, No. 10, pp. 4943-4950; Nov. 15, 1988.

"Silicon on Insulator Material Technology"; M. Bruel; Electronics Letters; vol. 31, No. 14, pp. 1201-1202; Jul. 6, 1995.

"C.M.O.S. Devices Fabricated on Buried SiO2 Layers Formed by Oxygen Implantation into Silicon"; No Author; Electronics Letters, vol. 14, No. 18, pp. 593-594; Aug. 31, 1978.

"Nondestructive Detection of Microvoids at the Interface of Direct Bonded Silicon Wafers by Scanning Infrared Microscopy"; N.Q. Khanh et al.; J. Electrochem. Soc. vol. 142, No. 7; pp. 2425-2429; Jul. 1995.

"Wafer Bonding and Layer Splitting for Microsystems"; Qin-Yi Tong et al.; Adv. Mater., vol. 11, No. 17, pp. 1409-1425; 1999.

"Silicon-On-Insulator By Wafer Bonding: A Review"; W.P. Maszara; J. Electrochem. Soc., vol. 138, No. 1, pp. 341-347; Jan. 1991.

"Investigations on Hydrophilic and Hydrophobic Silicon (100) Wafer Surfaces by X-Ray Photoelectron and High-Resolution Electron Energy Loss-Spectroscopy"; M. Grundner et al.; Appl. Phys. A, vol. 39, pp. 73-82; 1986.

"Development of a Miniature Pressure Transducer for Biomedical Applications"; Wen Hsiung Ko et al.; IEEE Transactions on Electron Devices, vol. ED-26, No. 12, pp. 1896-1905; Dec. 1979.

"Bonded Silicon-on-Sapphire Wafers and Devices"; George P. Imthurn et al; J. Appl. Phys., vol. 72, No. 6, pp. 2526-2527; Sep. 15, 1992.

"Silicon-to-Silicon Direct Bonding Method"; M. Shimbo et al.; J. Appl. Phys., vol. 60, No. 8, pp. 2987-2989; Oct. 15, 1986.

"Wafer Bonding for Silicon-on-Insulator Technologies"; J. B. Lasky; Appl. Phys. Lett., vol. 48, No. 1; Jan. 6, 1986.

"Novel HBT With Reduced Thermal Impedance"; Darrell Hill et al., IEEE Microwave and Guided Wave Letters, vol. 5, No. 11, pp. 373-375; Nov. 1995.

"A 3.2-GHz Second-Order Delta-Sigma Modulator Implemented in InP HBT Technology"; J.F. Jensen et al.; IEEE Journal of Solid-Stated Circuits, vol. 30, No. 10; pp. 1119-1127; Oct. 1995.

"Very High-Power-Density CW Operation of GaAs/AlGaAs Microwave Heterojunction Bipolar Transistors"; Burhan Bayraktaroglu et al.; IEEE Electron Device Letters, vol. 14, No. 10; pp. 493-495; Oct. 1993.

"Analysis of the Inductive Turn-off of Double Gate MOS Controlled Thyristors"; Alex Q. Huang; IEEE Transactions on Electron Devices, vol. 43, No. 6; pp. 1029-1032; Jun. 1996.

"The Effect of Fluorine in Silicon Dioxide Gate Dielectrics"; Peter J. Wright et al.; IEEE Transactions on Electron Devices; vol. 36, No. 5, pp. 879-889; May 1989.

Reaction of Wafer with Hydrofluoric Acid Treated Silicon (111) and (100) Surfaces); D. Graf et al.; J. Vac. Sci. Technol., A7(3); pp. 808-813; May/Jun. 1989.

"High—and—Low Temperature Bonding Techniques for Microstructures"; Dino R. Ciario; Proceedings of the Second International Symposium on Semiconductor Wafer Bonding: Science, Technology and Applications; Proceedings vol. 93-29; pp. 313-326; May 1993.

"Physical Microstructures in Device-Quality Hydrogenated Amorphous Silicon"; R.C. Ross et al.; Journal of Non-Crystalline Solids; vol. 66, pp. 81-86; 1984.

"Bonding Techniques for Microsensors"; W.H. Ko et al.; Micromachining and Micropackaging of Transducers; pp. 41-61; 1985.

"Silicon on Insulator Wafers Using the Smart Cut® Technology"; Auberton-Herve' et al.; Proceedings of the Eighth International Symposium on Silicon Materials Science and Technology, Silicon Materials Science and Technology, vol. 2, Electrochemical Society Proceedings, vol. 98-1, pp. 1341-1360, 1998.

Wafer Bonding: Studies of Interface Bubbles and Electrical Characterization; Kiyoshi Mitani; Department of Electrical Engineering, Duke University, 1991.

Semiconductor Wafer Bonding Science and Technology; Qin-Yi Tong et al; John Wiley & Sons, Inc. 1999.

"Metal Oxide Silicon Circuits on Silicon Membrane"; (no author); IBM Technical Disclosure Bulletin; p. 2079; Oct. 1979.

"SiN Membrane Masks for X-Ray Lithography"; Suzuki et al.; Journal of Vacuum Science and Technology; vol. 20, No. 2; pp. 191-194; Feb. 1982.

"Evaluation of Polycrystalline Silicon Membranes on Fused Silica for X-Ray Lithography Masks"; Trimble et al.; Journal of Vacuum Science and Technology B (Microelectronics Processing Phenomena); vol. 7, No. 6, pp. 1675-1679; Nov./Dec. 1989.

"Low Stress Tungsten Absorber for X-Ray Masks"; Ku et al.; Microelectronics Engineering, vol. 11, No. 1-4, pp. 303-308; Apr. 1990.

"Deliberate Design for Assuring Adequate Thermal Oxide Sidewall at the Corners of Trenches"; (no author); IBM Technical Disclosure Bulletin; pp. 261-262; Jul. 1991.

"Wafer Bonding with Stress-Free Trench Isolation"; (no author); IBM Technical Disclosure Bulletin; pp. 304-305; Jul. 1991.

* cited by examiner

US 6,984,571 B1

THREE DIMENSIONAL DEVICE INTEGRATION METHOD AND INTEGRATED DEVICE

BACKGROUND OF THE INVENTION

1. Field of the Invention

The present invention relates to three-dimensionally integrated semiconductor devices and, in particular, to semiconductor devices vertically bonded together to form three-dimensional structures.

2. Discussion of the Background

The ability to integrate determines the success of the semiconductor industry. This was first demonstrated with the invention of the integrated circuit (IC). The IC essentially consists of fabrication of electronic components at the surface of the semiconductor wafer followed by interconnection of these components with metalization on top of the components. The dramatic reduction in cost and increase in performance that has resulted from this integration has had a profound economic impact.

Since the invention of the IC, the semiconductor industry has experienced continued rapid growth due to continuous improvements in the integration density of various electronic components (i.e., transistors, diodes, resistors, capacitors, etc.) achieved. For the most part, this improvement in integration density has come from repeated reduction in minimum feature size which allow more components to be integrated in a given area. Additional improvement has come from increases in wafer size.

These integration improvements are essentially two-dimensional (2-D) in nature, in that the volume occupied by the integrated components is essentially at the surface of semiconductor wafer. Although dramatic improvements in lithography have resulted in considerable improvement in this 2-D integration, there are physical limits to the density which can be achieved in 2-D. One of these limits is simply the minimum size needed to make these components. Another limit is the significant increase in interconnect requirements between components as the component size is reduced.

Efforts to achieve integration beyond that available with 2-D has been explored and resulted in improvement in chip memory and further semiconductor industry growth. For instance, the trench capacitor uses significant semiconductor volume below the wafer surface and allows more functionality to be achieve in a given chip area. Other efforts, directed at achieving higher levels of integration by increased use of the volume in a given chip area, have recently increased. One approach has been to iterate the integration process by adding semiconductor material on top of the interconnect metalization followed by additional interconnect metalization. Although this potentially results in more components per chip area, it suffers from other problems including significantly increased thermal budgets. In addition, this and other efforts are distinct in that they only use one substrate and then work on one surface of that substrate. Not subjecting the devices to the thermal processes involved in fabricating the interconnect would simplify and enhance the fabrication of the devices.

Another problem results from the lagging of the ability to scale interconnect dimensions compared to scaling device dimensions. Ideally, one wants the critical dimension of a via to be the same as a gate dimension. However, since the scaling of vias lags the scaling of devices, integration density is limited.

Further problems arise when trying to integrate different types of technologies into a single circuit or wafer. BiCMOS is one example. Typically, special processing techniques must be devised to be able to combine the technologies. Processes required for one technology often interfere with processes required for another. As a result, compromises are made. The overall development of the combined technology becomes frozen in time, making flexible integration of the technologies that are being combined very difficult if not impossible. In other words, the most advanced "best of breed" technologies are not combined and evolutions in the technologies cannot be exploited.

Another problem of combining technologies is that customization must occur up front. One must first design the processing to combine the technologies and thus the limitations are built into the device. Again, one cannot easily take advantage of evolutions and improvements in technology since that requires redesigning the processing.

SUMMARY OF THE INVENTION

It is an object of the present invention to provide a method and device having high integration density.

It is another object of the invention to provide a method and device where different types of materials may be integrated.

It is a further object of the present invention to provide a method of integrating different types of devices, and a structure comprising the integrated devices.

It is yet another object of the invention to provide a method and device where different types of technologies are integrated.

It is a still further object of the invention to avoid or minimize the thermal budgets in interconnecting devices.

It is yet another object of the invention to allow the integration of the best available technologies without making significant processing compromises.

These and other objects of the invention may be achieved by a method of bonding including polishing respective first surfaces of first, second and third workpieces each to a desired surface roughness, bonding together said first surfaces of said first and second workpieces, polishing a second surface of one of said first and second workpieces after bonding to said surface roughness, and bonding said first surface of said third workpiece to said polished second surface.

The surfaces may be polished to a roughness of no more than about 5–10Å. The first workpiece may be obtained by forming a thin first material on a second material, the second workpiece may be obtained by forming a thin third material on a fourth material, and the third workpiece may be obtained by forming a fifth material on a sixth material. The method may include the steps of polishing the first, third and fifth materials to obtain the first surfaces.

The first and third materials may each be formed of a material having a high thermal conductivity and a high dielectric constant. The first, third and fifth materials may be selected from the group consisting of silicon dioxide, silicon and diamond-like carbon. The first, third and fifth materials may be formed to a thickness of about 1–10 times a surface non-planarity of the second, fourth and sixth materials, respectively.

The method may also include the steps of forming first through third semiconductor devices on respective first through third substrates as the first-third workpieces. Surfaces of the first and second semiconductor devices may be polished to obtain the respective first and second surfaces. In this example, a first material may be formed on the surface of the first semiconductor device and a second material may be formed on the surface of the second semiconductor device. The first and second materials may be polished to obtain the respective first and second surfaces.

An exposed surface of one of the first and second semiconductor devices may be polished to a desired surface roughness after bonding the first and second surfaces, and the first surface of the third semiconductor device may be bonded with the exposed surface.

In another example, an exposed surface of one of the first and second semiconductor devices may be polished to a surface roughness of no more than about 5–10Å after bonding the first and second surfaces. Surfaces of N-2 semiconductor devices may be polished each having a surface roughness of about no more than 5–10Å. The N-2 semiconductor devices may be bonded to the bonded first and second semiconductor devices to obtain an N-integrated bonded device. Substrates of each of the N-2 semiconductor devices may be removed in the integration process.

The first-third semiconductor devices may each comprise integrated circuits formed on substrates. One of the substrates of the first and second semiconductor devices may be removed after the bonding step. A surface exposed by removing the substrate may be polished to a surface roughness of about no more than 5–10 Å, a surface of a third semiconductor device may be polished to a surface roughness of about no more than 5–10 Å, and the surface of the third semiconductor device and the polished exposed surface may be bonded.

The method may also include the steps of using a surrogate substrate as the first workpiece, forming an integrated circuit on a second substrate as the second workpiece, polishing a surface of the first substrate, polishing a surface of the integrated circuit, and bonding the first substrate and the integrated circuit. A second surface of the integrated circuit may be polished, a second integrated circuit may be formed on a third substrate as the third workpiece, a surface of the second integrated circuit may be polished, and the polished surface of the second integrated circuit may be bonded to the first integrated circuit.

A first material may be formed on the surface of the substrate and polished. A second material may be formed on the surface of the integrated circuits and polished. The first and second materials may be formed to a thickness of about 1–10 times a surface non-planarity of the surfaces of the substrate and integrated circuits, respectively.

The method may also include steps of forming N thin films on a first material to obtain the first workpiece and polishing an uppermost one of the N films to obtain the desired surface roughness, and forming M thin films on a second material to obtain the second workpiece and polishing an uppermost one of the M thin films to obtain the desired surface roughness. The method may also include at least one of the steps of polishing at least plural of the N thin films and polishing at least plural of the M thin films.

A surrogate substrate may be used as the first workpiece. A stress relieving layer may be formed on the surrogate substrate. A thin film may be formed on the stress relieving layer and the thin film may be polished to obtain the desired surface roughness.

The method may also include interconnecting the semiconductor devices. The connections may be between circuits or between individual devices. Interconnecting the two devices may include bonding a multi-layer interconnection to one of the devices after bonding the two devices.

After bonding the first and second semiconductor devices, one of the substrates may be removed to expose a surface. This surface may be polished and a third semiconductor device may be bonded to the polished exposed surface.

Semiconductor devices and integrated circuits of different technologies may be integrated.

The method according to the invention may also comprise bonding a first semiconductor device having a first substrate to a second semiconductor device having a second substrate, removing a portion of said first substrate to expose a remaining portion of said first semiconductor device, and interconnecting said first and second semiconductor devices.

Substantially all of the substrate may be removed. Surfaces of the first and second devices may be planarized and bonded. Interconnecting the devices may comprises bonding a multi-layer interconnection to one of the devices. A surrogate substrate may be bonded to one the devices, and the corresponding substrate removed. The other of the devices may be bonded to the portion exposed by removing the substrate.

A third device may be bonded to the first and second devices, and the three devices may be interconnected. A substrate of the third device may be removed before interconnection.

The objects of the invention may also be achieved by a bonded device having a first workpiece having a first surface with a surface roughness and a second workpiece having respective second and third surfaces each having the surface roughness, the first and second surfaces being bonded together. A third substrate has a fourth surface with the surface roughness. The third and fourth surfaces are bonded together. The first workpiece may include a thin first material disposed upon second material, the second workpiece may include a thin third material disposed on a fourth material and the third workpiece may include a thin fifth material disposed on a sixth material. Surfaces of the thin first, third and fifth materials may comprise the first, second and fourth surfaces, respectively.

Each of the thin first, third and fifth materials may comprise a material having a high thermal conductivity and a high dielectric constant and may be selected from the group consisting of silicon, silicon dioxide and diamond-like silicon carbide. The thin first, third and fifth materials may have a thickness of about 1–10 times a surface non-planarity of the second, fourth and sixth materials, respectively. The thin first, third and fifth materials may each include a plurality of thin layers, an uppermost one of each of the plurality of layers comprising the first, second and fourth surfaces, respectively.

The first, second and third workpieces may comprise first, second and third semiconductor devices, respectively. The first, second and third semiconductor devices may comprise first, second and third integrated circuits, respectively. The first, second and third semiconductor devices may comprise first through third 2-D arrays of unconnected devices. The second and third devices may have substantially all of their respective substrates removed.

The first workpiece may comprise a surrogate substrate, and the second and third workpieces may each comprise a semiconductor device. The surrogate substrate may comprise a thin first material disposed upon a second material, where the first material comprises the first surface. The semiconductor devices may each include a thin material disposed on an integrated circuit and the thin materials comprises the second and third surfaces, respectively. The thin first, second and third materials may have a thickness of about 1–10 times a surface non-planarity of the second material and the two integrated circuits, respectively.

The first workpiece may include a thin first material, a second material and a stress relieving material formed between the thin first material and the second material, or the second workpiece may include a thin third material, a fourth material and a stress relieving material formed between the thin third material and the fourth material. Surfaces of the thin first and third materials may include the first and second surfaces, respectively.

The device according to the invention may also comprise an integrated device having a first semiconductor device, a second semiconductor device, comprised of a layer of devices formed on a substrate which has been at least partially removed, bonded to said first semiconductor device, and interconnections connecting said first and second semiconductor devices.

The second device may comprises said layer of devices formed on a substrate which has been substantially removed, and a third semiconductor device, comprised of a layer of devices formed on a substrate which has been at least partially removed, may be bonded to the second device. The interconnections may comprise a multi-layer interconnection bonded to the second device. The first device may comprise a layer of devices formed on a substrate which has been substantially removed bonded to a surrogate substrate, and the second device may comprise the layer of devices formed on a substrate which has been substantially removed. The second and third workpieces may be of different technologies.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
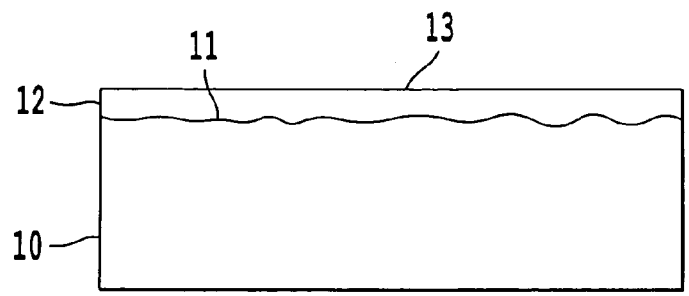
FIG. 1 is a sectional diagram illustrating a step in the method according to the invention.

Referring now to the drawings, and more particularly to FIG. 1 which illustrates a first embodiment of the method and device according to the invention. A substrate 10 has a upper surface 11 having a surface planarity. Substrate 10 preferably is a surrogate substrate or an integrated circuit wafer. The non-planarity of surface 11 shown in FIG. 1 is for illustrative purposes and is not meant to depict exact surface planarity conditions. Substrate 10 preferably has a relatively smooth and planar surface 11. The desired smoothness and planarity of the upper surface may be achieved through polishing. Chemical-mechanical polishing or CMP is one manner of achieving the desired smoothness and planarity. The CMP process is optimized with appropriate selection of polishing pads, polishing slurries and polishing conditions to obtain the desired surface roughness and planarity.

On surface 11 is deposited a film 12 having a thickness greater than the surface non-planarity of surface 11. Film 12 should have good thermal conductivity and a high dielectric constant, such as $SiO_2$, diamond or diamond-like carbon (DLC). Thermal conductivities in the range of 1–10 W/cmK and relative dielectric constants in the range of 1–3 are preferable. A preferable range of thickness for film 11 is from 1–10 times the surface non-planarity of film 11. The upper surface 13 of film 13 is then polished to a planar surface with a roughness of 5–15 Å and preferably between 5–10 Å. A planar surface with a roughness of ≦5 Å is most preferred as a smoother planar surface will enhance the bonding properties of the film.

Figure 2:
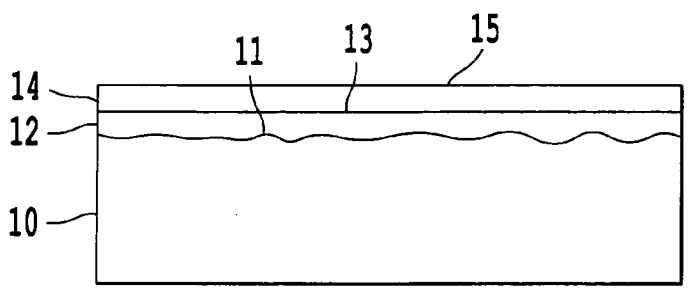
FIG. 2 is a sectional diagram illustrating a step in the method according to the invention.

It is also possible to deposit film 12, polish upper surface 13, and then deposit another film (14 in FIG. 2), and polish the second film, to achieve the desired smoothness of the upper surface (15 in FIG. 2). Three or more films, repeating the depositing and polishing operations for each or for at least the upper film, may be used to achieve the desired surface roughness and planarity.

Figure 3:
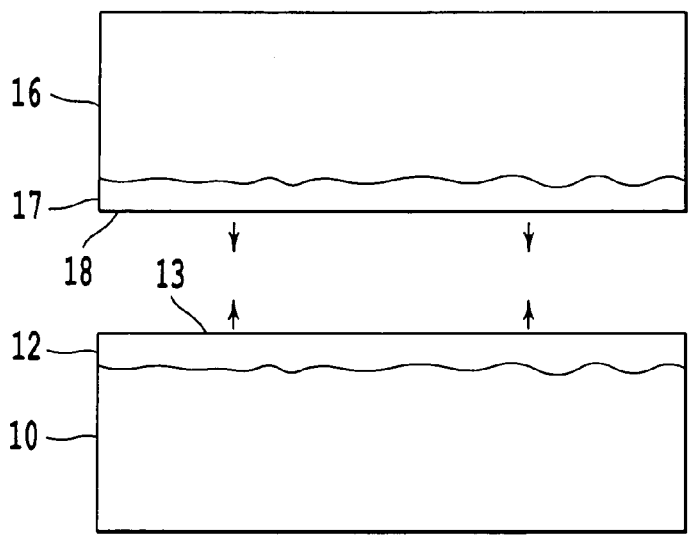
FIG. 3 is a sectional diagram illustrating bonding two substrates according to the invention.
Figure 4:
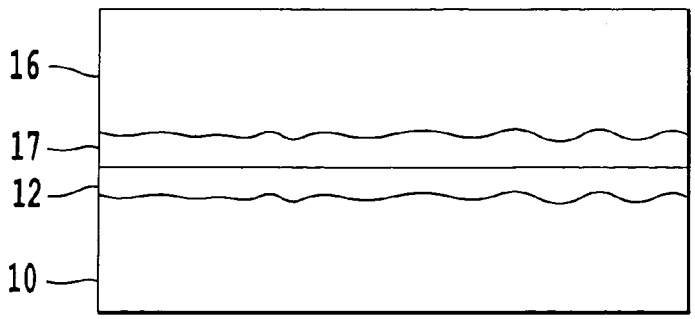
FIG. 4 is a sectional diagram a bonded device according to the invention.

The substrate 10 is now ready for wafer bonding. Any type of substrate may be bonded to substrate 10. Referring to FIG. 3, a substrate 16, preferably an integrated circuit wafer containing active devices, is prepared in the same manner as substrate 10 by forming a film 17 having an exposed surface 18 with a surface roughness in the same range as surface 13 of film 12 (or surface 15 of film 14). A higher degree of planarity will further facilitate the bonding process. Film 17 may be formed of one or more layers with one or more polishing operations, as described above. Surfaces 18 and 12 are brought into contact with each other (shown by the arrows in FIG. 3). A bond, such as a Van der Waals bond, between surfaces 18 and 13 is formed (FIG. 4). A stronger bond can be achieved by subsequently heating the joined substrates and films.

The preferred manner of bonding is direct bonding without the use of applied pressure, voltage or temperature. It the substrate has an upper surface of $SiO_2$ (or other bonding material), one can polish that surface without depositing another $SiO_2$ layer, assuming that the upper surface of $SiO_2$ has sufficient thickness to obtain a sufficient surface roughness and planarity with, e.g., CMP.

EXAMPLE

This example uses the case of attachment of a diamond substrate to a material such as GaAs, InP, or GaN when optimal thermal packaging and dielectric performance are desired. Bonding to a substrate of a material having a high thermal conductivity allows one to better manage thermal transfer. The diamond substrate, after preparing it for bonding, has a relatively smooth upper surface. As diamond substrates typically have a relatively rough surface, a relatively smooth and planar upper surface may be obtained by polishing. Polishing may be expensive and difficult to consistently obtain very smooth surfaces. It is also possible to form the diamond substrate on a copper susceptor. Diamond films typically "pop-off" the copper susceptor after deposition as the temperature is lowered, leaving a relatively smooth and planar surface where growth initiated and a rougher surface where growth terminated.

On top of the upper surface is deposited a thin layer of silicon dioxide. The silicon dioxide layer should be thicker than the non-planarity of the diamond surface, e.g., 1–10 times, but as thin as possible to optimize performance. The silicon dioxide layer is then polished to a smooth surface suitable for wafer bonding, for example, $\leq 5$ Å. The diamond substrate having the thin silicon layer is now ready for wafer bonding.

Figure 5:
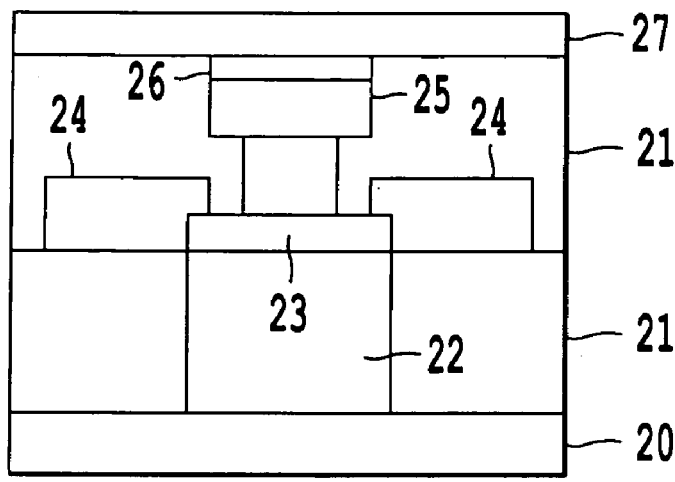
FIG. 5 is a sectional diagram of a heterojunction bipolar transistor.

At this point any type of device formed on any type of substrate may be bonded to the surface of silicon dioxide layer. For this example, a heterojunction bipolar transistor (HBT), as described in application Ser. No. 09/165,203, the disclosure of which is incorporated herein by reference, may be used. The HBT is processed to the point where it is ready for attachment of a surrogate substrate, as shown in FIG. 5. Typically, this would include the steps of forming the emitter metalization, performing base etching, applying base metalization, applying a passivation/planarization level and applying a thermal shunt. In FIG. 5 there is collector layer 22 formed on a GaAs substrate 20, planarizing material 21, base region 23, base contacts 24, emitter 25 and emitter contact 26. It should be noted that FIG. 5, while illustrating a single device, is not so limited. A wafer containing a number of devices or an integrated circuit may also be bonded in the same manner.

On top of the planarized surface of the HBT is deposited another very thin layer of silicon dioxide 27. The thickness of silicon dioxide layer 27 is thicker than the non-planarity of the planarized surface of the HBT (e.g., 1–10 times) but as thin as possible to optimize performance. The surface of the silicon dioxide layer 27 is polished to a smoothness sufficient for wafer bonding, for example $\leq 5$ Å. Layers 27 and 12 are then bonded by placing them in close proximity. The surfaces are preferably placed in close proximity after a wet cleaning process, followed by a drying operation to force the liquid from between the layers 27 and 12. A Van der Waals bond is formed. A stronger bond can be achieved by subsequently heating joined layers 27 and 12.

Figure 6:
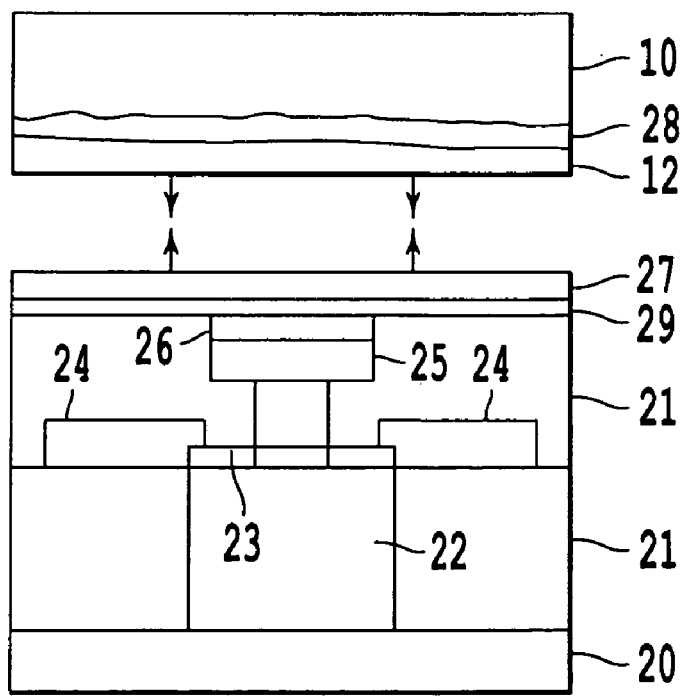
FIG. 6 is a sectional diagram illustrating bonding the transistor of FIG. 4 according to the invention.

When layers 12 and 27 are heated after joining, stress may be generated which lead to some deleterious effects in the formed device and surrogate substrate. It is possible to form a stress-relieving layer between the diamond substrate and silicon dioxide layer and between the HBT device and silicon dioxide layer 27. This is illustrated as films 28 and 29 in FIG. 6. The stress relieving layer is a homogeneous or composite layer with material, i.e., Young's modulus, such that this layer will yield the application of stress before other layers.

While the bonding has been described using a silicon dioxide film polished to a desired surface roughness, other films are possible. For example, silicon or DLC may also be used. In the case of silicon, oxygen may be implanted into the bonding layers below their respective surfaces to form a compliant layer. The compliant layer is a layer equivalent to the stress-relieving layer. One would prefer to use a Si, SiC or DLC film versus an $SiO_2$ film, when, for example, improved thermal conductivity is desired.

It is also possible to choose the passivation/planarization material in the device being bonded to optimize the dielectric constant, thermal conductivity and resistivity adjacent to the active device. In particular, DLC is effective due to it relatively high thermal conductivity and low dielectric constant compared to other materials.

As shown in FIG. 5, the HBT device 14 typically is formed on substrate 20. After bonding the device to substrate 10, substrate 20 can be removed through a process such as polishing, or grinding and polishing, allowing access to backside contacts.

Figure 7:
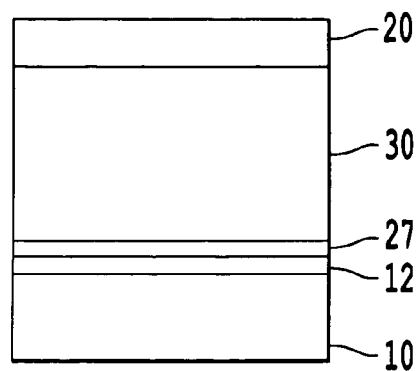
FIG. 7 is a sectional diagram of a bonded device according to the invention.
Figure 8:
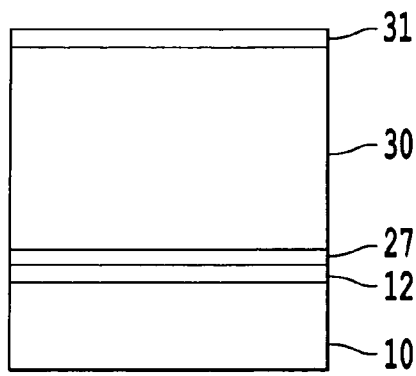
FIG. 8 is a sectional diagram illustrating a step in bonding together two devices according to the invention.

In a second embodiment of the invention, N 2D arrays of devices are bonded together by repeating the method described in the first embodiment N times. Starting with the bonded device shown in FIG. 7 (the HBT device is shown without the component detail as 30), the substrate 20 is removed and the exposed surface of device 30 is polished, if necessary, to a level of smoothness advantageous for wafer bonding. Polishing and grinding may be used during the removal of substrate 20. Another layer of silicon dioxide 31 is deposited on the exposed surface of device 30 and polished to the desired surface roughness, in a manner as described above for layers 12 or 27 (FIG. 8).

Figure 9:
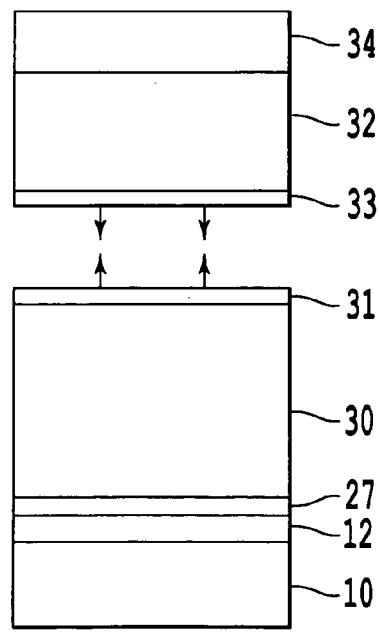
FIG. 9 is a sectional diagram illustrating a step in bonding together two devices according to the invention.
Figure 10:
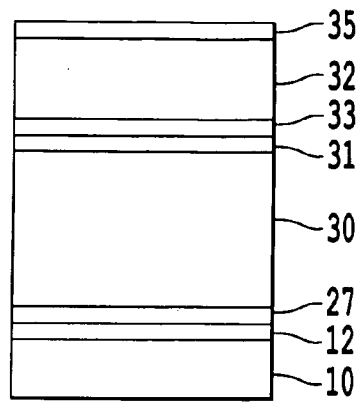
FIG. 10 is a sectional diagram illustrating two devices bonded according to the invention.

A next wafer, shown without the device details as 32 with substrate 34 in FIG. 9 has a thin layer of silicon dioxide 33 formed on the surface opposite substrate 34. Film 33 is formed and polished in the same manner as films 11, 27 and 31. Film 33 is then bonded to the exposed surface of layer 31. The resulting device is shown in FIG. 10, after removal of the substrate 34. The upper surface of the second bonded device may again be polished, another silicon dioxide layer 35 deposited in preparation for bonding of a third device. This can be N times to produce an N-integrated device. The devices so bonded may be interconnected vertically.

EXAMPLE

An example of the bonding between multiple devices is shown in FIGS. 11A, 11B and 12–15. FIGS. 11A, 11B and 12–15 illustrate how the bonding according to the present invention can be used to integrate N 2D arrays of devices, how they can be interconnected to form a vertically-integrated multi-wafer module, and how different technologies may be joined.

Figure 11A:
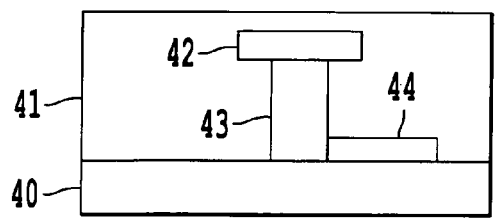
FIGS. 11A and 11B are sectional diagrams of two devices to be bonded according to the invention.
Figure 11B:
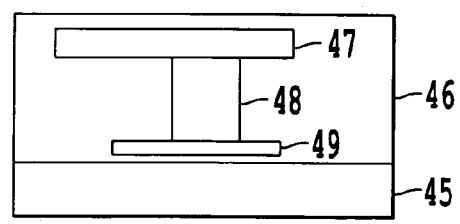
Figure 12:
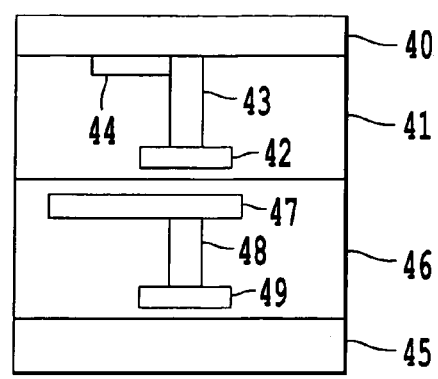
FIG. 12 is a sectional diagram illustrating bonding of the devices of FIGS. 11A and 11B.

FIGS. 11A and 11B illustrate two devices to be bonded. In this example, the devices of FIGS. 11A and 11B are dissimilar integrated circuit wafers having interconnections. In FIG. 11A a symmetric-intrinsic HBT (SIHBT) wafer contains an SIHBT surrogate substrate 40, planarizing material 41 formed on substrate 40, SIHBT device 43 and interconnects 42 and 44, preferably formed of a metal. FIG. 11B illustrates a VCSEL device having a VCSEL substrate 45, planarizing material 46, VCSEL device 48 and interconnects 47 and 49, again preferably formed of metal. As shown in FIG. 12, the devices of FIGS. 11A and 11B are bonded in the method as described above, that is, a material such as silicon dioxide is deposited on the upper surface of each device and then polished to a surface roughness of about 5–10 Å. A high degree of planarity is also desirable. The bonded devices are shown in FIG. 12.

Figure 13:
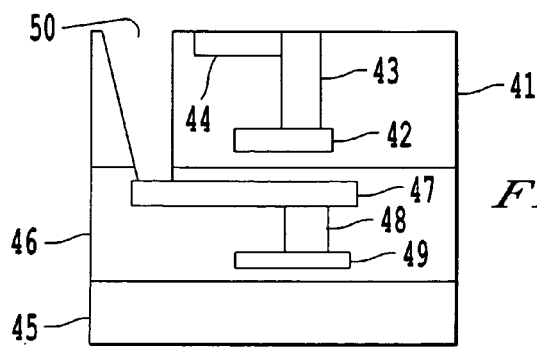
FIG. 13 is a sectional diagram illustrating a step of interconnecting the devices of FIGS. 11A and 11B.

Next, as illustrated in FIG. 13, substrate 40 is removed exposing interconnect 44. A via hole 50 is etched through planarizing material 41 and into planarizing material 46 to expose a portion of interconnect 47. While one via hole 50 is shown, it is to be understood that any number of vias may be formed in order to make the appropriate connection(s) to the devices in the two bonded substrates.

Interconnect 51 is formed in via hole 50 interconnecting the devices 43 and 48. At this point the process could be stopped if only two wafers were required to be bonded. If one or more devices need to be further integrated, the process may continue by forming a bonding layer 52 made of, for example, silicon dioxide, which is then polished to a surface roughness of 5–10 Å, in the same manner as described above. In this case, the process may include a step of filling any cavity formed in interconnect 50 to more easily produce a smooth surface of layer 52. The device, as shown in FIG. 14 is now ready to be bonded with another wafer, if desired.

For the wafers of different technologies, the planarizing material may be the same. The two different technologies are separated by the layers of planarizing material do not interact. Each only interacts with the planarizing material. Since the properties of the planarizing material are both well known and are commonly used in current processes, no new materials are needed to combine the technologies. The invention provides a very manufacturable manner of combining different technologies.

Moreover, all of the customization takes place at the end of the processing. Both wafers are separately manufactured and then bonded. The interconnection is performed after the bonding. Customization of combined technologies takes place at the end of the process. Whatever technology one needs may be obtained, and these technologies may be those that are readily and commercially available. The need for designing a new process is eliminated. More control over the final combined product is possible as well-defined and devices fabricated with a stable process may be selected for combining, unlike a new, unqualified combined process where little manufacturing, reliability or longer term information is available.

Figure 14:
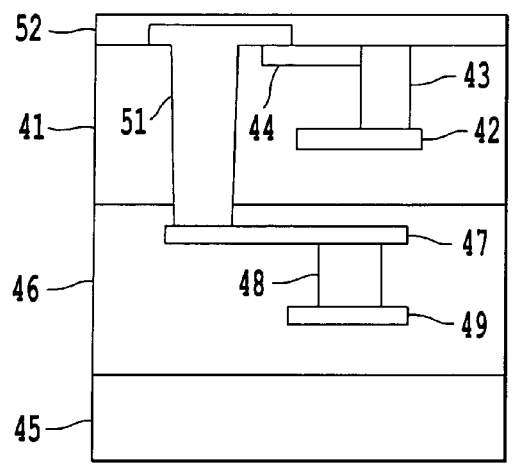
FIG. 14 is a sectional diagram illustrating a step of bonding the bonded devices of FIGS. 11A and 11B to another device.
Figure 15:
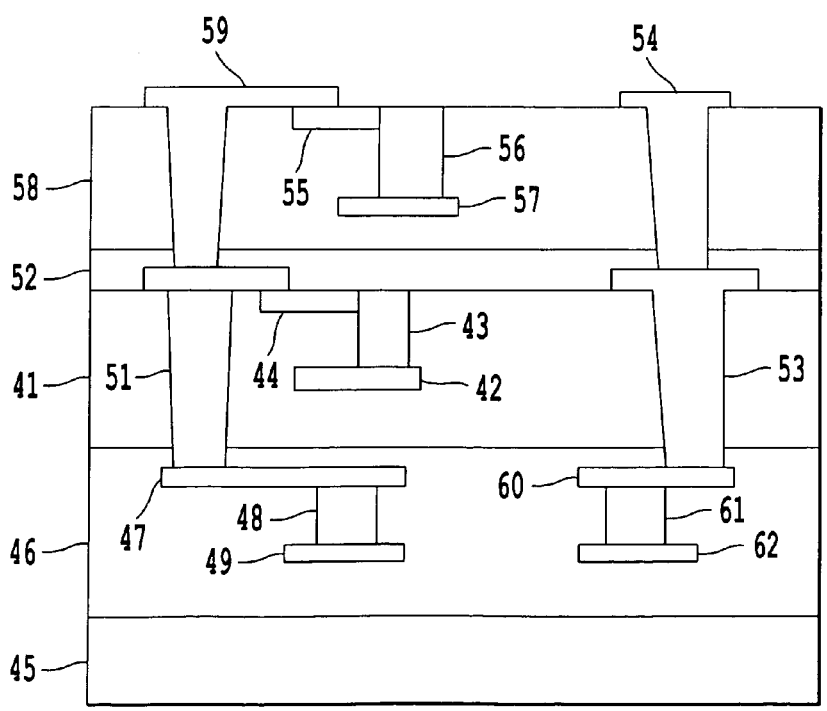
FIG. 15 is a sectional diagram illustrating bonding and interconnecting three devices.

The bonding of a third wafer to the structure of FIG. 14 is illustrated in FIG. 15. It is noted that FIG. 15 illustrates an additional metalization 53 formed by etching planarizing material 41 and 46 to expose a portion of interconnect 60 of another device having elements 60–62. Interconnect 53 has an extended portion on the surface of planarizing material 41 to facilitate interconnection on another level. The device in the third wafer in this case can be a CMOS device 56 having interconnects 55 and 57. Another via is etched through planarizing material 58 and through bonding material 52, exposing a portion of interconnect 51 to allow connection with interconnect 59. Interconnect 59 is also connected with interconnect 55 of CMOS device 56. Another interconnect 54 is formed by etching a via through materials 58 and 52 to expose a portion of interconnect 53. An interconnect 54 is formed to contact interconnect 53. It should be noted that FIG. 15 does not explicitly show the bonding layers formed between the devices but is to be understood that these are the devices are formed using the process described above in connection with the first embodiment.

What is also apparent from FIG. 15 that the present invention utilizes both sides of a contact. For example, if the pad at the top of contact 51 is a contact pad or a metal line, then the bottom surface of the pad (or line) is connected with interconnect 47 lying under the pad (or line) while the tope of the pad (or line) is connected with contact 59 overlapping with interconnect 55. This can reduce drive requirements.

FIG. 15 also illustrates the advantage of the invention of not being constrained to one layer (or possibly two layers) for circuit topography. One has the ability to design three dimensionally. Circuit layouts can be optimized if one is given the ability to separate a type or class of device from others where either the functioning or processing interferes or is incompatible. Circuit layouts are minimized in area since three dimensions are used instead of only two. For example, three conventional chips of nominally the same area with optionally different technologies can be implemented in one third the area by stacking vertically. The area reduction is even greater if one considers the reduced packaging requirements of the individual chips vs. the stacked chips. Stacking vertically is also conducive to the insertion of ground, bias, or other planes between chips or within a chip for improved signal isolation during routing.

Typically, in a system signals are amplified and then transmitted over buses between integrated circuits. This requires a lot of level-shifting, buses and compensation for various differences in signal levels amongst the elements making up the system. As one example, a pixel in a light detecting device receives a very small packet of charge which is then shifted out of the device and into a memory device. The light detecting device and the memory in this case may both be separate integrated circuits, requiring amplification of the charge packet through buffers and system buses between the pixel and memory device. The signal levels are then shifted down in order to store the information in a memory cell in the memory device. When the information in the memory is needed to be processed, the information is then level-shifted again using more buffers and system buses to transmit the data over to a processor, which also may be formed using a separate integrated circuit. The power levels for the various signals are determined by the interconnection and the buses.

Figure 16A:
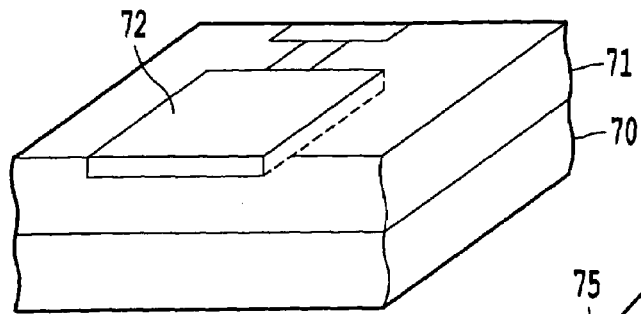
FIGS. 16A–16D are diagrams illustrating bonding three integrated circuits.
Figure 16B:
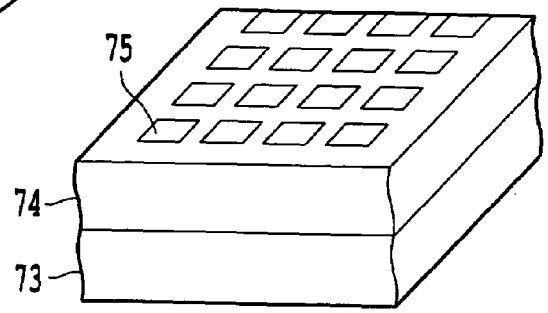

The present invention allows one to obtain element-to-element communication and addressability. In the present, the power levels of signals may be determined by the element, and not the interconnect, i.e., the system buses and drivers. As an example, as shown in FIGS. 16A–16D, a first integrated circuit consisting of an array of pixels for sensing a light signal, etc. is fabricated on a first substrate (FIG. 16A). In simplified fashion, the a pixel 72 is formed in a semiconductor layer 71, which is formed on a substrate 70. On a second substrate is fabricated the memory device needed to store the information when it is shifted out of the pixel array, and is shown in FIG. 16B. A semiconductor layer 74 is formed on a substrate 73. Memory cells 75 are formed in layer 74. Lastly, a processor device for processing the information is manufactured on a third substrate shown in FIG. 16C. Various elements 78 are shown (in simplified form) in layer 77 formed on substrate 76. Each of the substrates may then be bonded together (with the pixel array on top in order to expose it to the light).

The three substrates may be bonded together. A surrogate substrate (not shown) may be attached to an upper surface of layer 71 using the techniques described above, and substrate 70 removed. The upper surface of layer 74 of the memory device is then bonded to the surface exposed by removing substrate 70. Substrate 73 may then be removed, and the upper surface of layer 77 is bonded to the surface exposed by removing substrate 73. The surrogate substrate may be removed to exposed the pixels 72. The interconnections may be made directly between the three substrates, in the manner discussed above, eliminating the need for the numerous buffers and system buses required to interconnect the system when the system is designed using separate integrated devices. The bonded circuit is shown in FIG. 16D. It should be noted that FIG. 16D does not illustrate the various layers used to bond the different devices, and the portions of the layers 71, 74 and 77 may be removed during the removal of the corresponding substrates, as desired.

Another example would be a typical microprocessor where the microprocessor contains a certain amount of on-board ROM while a larger amount of storage is accessed via system buses on a separate RAM. In this case, the processor with the on-board ROM may be fabricated on a first substrate and the memory may be fabricated on a second substrate. The two substrates are to be bonded together and the processor directly bonded to the memory device, again eliminating the need for system buses, level shifters and other buffers.

The present invention not only allows the fabrication of systems in a more compact and directly accessible manner, but also allows a smaller footprint. Each of the separate it devices described above would take up at least three times the amount of space compared to the present invention they are stacked upon each other, assuming chips of about the same size.

A fourth embodiment of the invention uses the techniques described above to create the interconnect separately from the underlying integrated circuit. Typically, circuits require a number of levels of interconnect in order to provide all the complex functions required. Six or more levels of interconnect may be needed. This requires a significant amount of thermal processing, exposing the underlying active devices to higher thermal budgets and complicating the fabricating process. The present invention may be used to fabricate the active devices separately and then forming layers of interconnect by bonding according to the present invention. In particular, each level of interconnect may be formed on separate substrates, then bonded together and interconnected as needed. Several or all of the interconnect layers may be fabricated at one time. The bonded together or single interconnected substrate may then be bonded to the substrate having the active devices. Techniques similar to those described above for interconnecting the different wafers shown in FIG. 15 may be employed. When finished, the stack of interconnected layers may be bonded to the active devices.

Figure 16C:
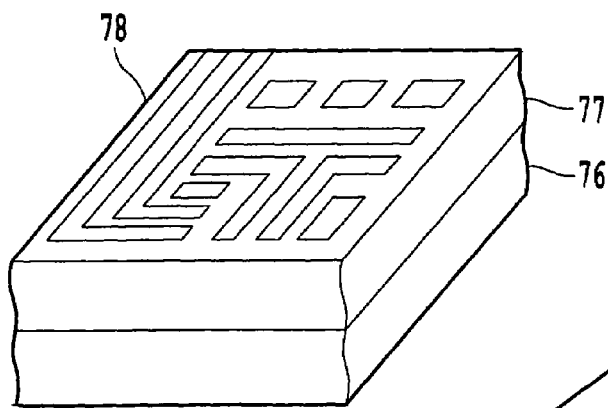
Figure 16D:
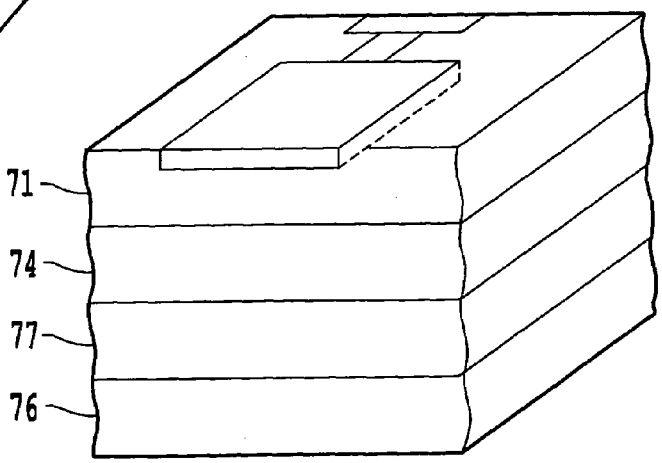
Figure 17A:
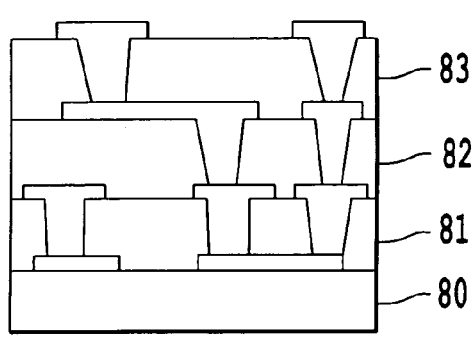
FIG. 17A is a diagram of a layered interconnect structure.
Figure 17B:
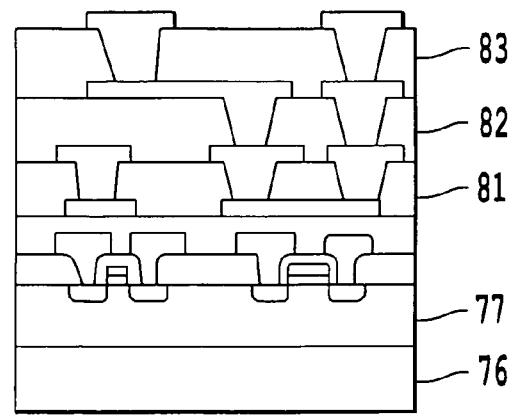
FIG. 17B is a diagram of bonding the layered interconnect structure of FIG. 17A to an substrate having integrated circuits.

This is illustrated in FIGS. 17A and 17B, where a stack of interconnect having layers 80–83 is bonded according to the principles of the invention and shown in FIG. 17A is then bonded to the integrated circuit shown in FIG. 16B or 16C. FIG. 17B shows the completed device with the layers used in the bonding process omitted for clarity. In this case, the substrate of the integrated circuit may be removed and bonded to a more favorable thermal material, such as diamond-like carbon. With this embodiment, one can obtain tighter processing control by not having to compensate or make compromises for the various effects of the increased thermal budget due to the typical processing of the multiple layers of integrated circuit interconnection on top of the active devices.

Another application of the invention is the selection of the interconnect layers. By being able to separately process the interconnect, more design flexibility may by obtained. Certain layers, for example those handling high speed signals, may be more critical than others. The critical levels may be separated from each other by other non-critical layers to minimize overlap. Conversely, non-critical layers may be put in adjacent layers when the overlap is not a problem for high speed operation of the device.

Figure 18:
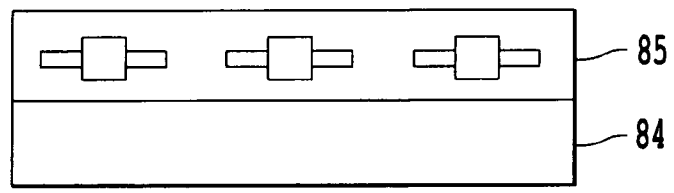
FIG. 18 is a diagram of a 2-D array of circuit elements.

Apparent from the above embodiments, the substrate of the integrated circuits may be completely removed in the above embodiments. The result is a 2-D array of device elements immersed in insulative planarizing material. One example of this is shown in FIG. 18. Each of the elements may be completely isolated from every other element, i.e., a 2-D array of devices as opposed to a circuit layer. A second wafer to be bonded may be processed in the same way, giving another 2-D array of device elements. The arrays of devices may then be interconnected in a desired manner to create circuits, subcircuits, etc. This can be extended to bonding different technologies together, for example, CMOS and bipolar, to create a BiCMOS wafer. In this case the most advanced CMOS and bipolar technologies may be combined since the two wafers are separately processed. One can then, when needing to create a combined technology device or circuit, use existing advanced, qualified technologies rather than having to design a new combined process or settle for an existing combined technology which does not use and cannot take advantage of the most advanced technologies or evolutions in technologies.

Figure 19:
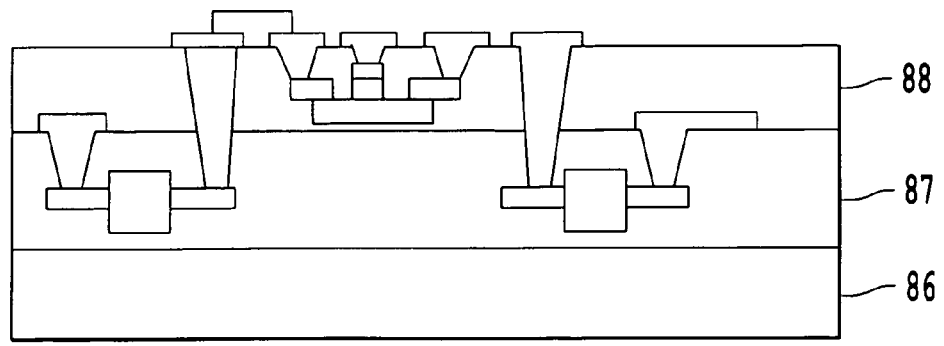
FIG. 19 is a diagram of bonded and interconnected 2-D arrays of circuit elements.

Third wafer and subsequent wafers may also be processed where the substrate is removed to create a 2-D array of devices ready to be bonded to the first and second arrays. The third device may be yet another technology. FIG. 19 gives an example.

While particular devices and materials have been described in connection with the first and second embodiments, the invention is not so limited. The invention is applicable to any type of device formed on any type of substrate. Moreover, any type of technology may be used to fabricate the devices being bonded. For example, GaAs devices on a GaAs substrate may be bonded to HBT devices. Also, silicon-based devices formed on silicon wafers may also be bonded to either the GaAs-based devices or the HBT type devices. Technologies such as CMOS, BiCMOS, npn and pnp HBT, VCSEL, PIN, HFET, MESFET, MOSFET, and JFET may also be used.

The method according to the invention provides a three-dimensional, laminar integrated circuit structure. The device is a multi-chip module having a high integration density with reduced interconnection parasitics compared to other multi-chip modules. The module offers great flexibility as it can combine different devices and different technologies.

Obviously, numerous modifications and variations of the present invention are possible in light of the above teachings. It is therefore to be understood that within the scope of the appended claims, the invention may be practiced otherwise than as specifically described herein.

What is claimed as new and desired to be protected by Letters Patent is:

1. A method of integrating workpieces each having a first surface and an opposing second surface, comprising:
    polishing respective first surfaces of first, second and third workpieces each to a desired surface roughness;
    bonding together said first surfaces of said first and second workpieces without application of temperature or sustained pressure;

polishing a second surface of one of said first and second workpieces after bonding to said surface roughness;

bonding said first surface of said third workpiece to said polished second surface without application of temperature;

removing at least a substantial portion of one of said second and third substrates using one of polishing and grinding after said respective bonding steps; and obtaining a bond strength at about room temperature sufficient to permit said removing step.

2. A method of integrating semiconductor devices, comprising:

bonding a first surface of a first semiconductor device formed in a first substrate to a second surface of a second semiconductor device formed in a second substrate by bringing into contact said first and second surfaces at about room temperature;

removing a portion of said first substrate to expose a remaining portion of said first semiconductor device using one of polishing and grinding after bonding;

interconnecting said first and second semiconductor devices after bonding; and obtaining a bond strength at about room temperature sufficient to permit said removing step.

3. A method as recited in claim 1, wherein bonding together said first surfaces of said first and second workpieces comprises bringing into contact said first surfaces of said first and second workpieces.

4. A method as recited in claim 2, wherein bonding said first semiconductor device having said first substrate to said second semiconductor device having said second substrate comprises bringing into contact surfaces of said first and second semiconductor devices.

5. A method of integrating substrates each having a first surface and an opposing second surface, comprising:

forming a first bonding layer, having a first bonding surface with a range of desired surface roughness, on a first surface of a first substrate, said first substrate having a first semiconductor device formed therein;

forming a second bonding layer, separated from said first bonding layer and having a second bonding surface with said range of desired surface roughness, on a first surface of a second substrate, said second substrate having a second semiconductor device formed therein;

bringing into contact said first and second bonding surfaces;

bonding together said first and second substrates to form a bonded pair at about room temperature;

removing at least a portion of said second substrate by one of polishing and grinding after said bonding;

interconnecting said first and second semiconductor devices after bonding said first and second substrates; and obtaining a bond strength at about room temperature sufficient to permit said removing step.

6. A method as recited in claim 5, wherein bonding said first and second substrates comprises said step of bringing into contact.

7. A method as recited in claim 5, comprising:

removing at least of portion of said second substrate to form a remaining portion, said remaining portion containing said second semiconductor device; and interconnecting said first and second semiconductor devices after said removing step.

8. A method as recited in claim 5, comprising:

after said bonding step, removing at least of portion of said second substrate from said bonded pair to form a first remaining portion, said first remaining portion containing said second semiconductor device;

forming a third bonding layer, having a third bonding surface with said range of desired surface roughness, on a first surface of a third substrate, said third substrate having a third semiconductor device formed therein;

forming a fourth bonding layer, having a fourth bonding surface with said range of desired surface roughness, on said first remaining portion;

bringing into contact said third and fourth bonding surfaces;

bonding together said third substrate and said first remaining portion; and interconnecting at least said second and third semiconductor devices after bonding said third substrate to said first remaining portion.

9. A method as recited in claim 8, comprising:

interconnecting said first, second and third semiconductor devices after bonding said third substrate to said first remaining portion.

10. A method as recited in claim 8, comprising:

forming a multilayer interconnect;

removing at least a portion of said third substrate to leave a second remaining portion, said second remaining portion containing said third semiconductor device;

bonding said multilayer interconnect to said second remaining portion; and interconnecting said first, second and third semiconductor devices using said multilayer interconnect.

11. A method as recited in claim 10, wherein bonding said multilayer interconnect to said second remaining portion comprises:

forming a fifth bonding layer, having a fifth bonding surface with said range of desired surface roughness, on said second remaining portion;

preparing a sixth bonding surface on said multilayer interconnect; and brining into contact said fifth and sixth bonding surfaces.

12. A method as recited in claim 5, comprising:

removing said second substrate to leave substantially only said second semiconductor device.

13. A method as recited in claim 5, comprising:

after said bonding step, removing at least of portion of said second substrate from said bonded pair to form a remaining portion, said remaining portion containing said second semiconductor device;

forming a third bonding layer, having a third bonding surface with said range of desired surface roughness, on a first surface of a third substrate;

forming a fourth bonding layer, having a fourth bonding surface with said range of desired surface roughness, on said remaining portion;

bringing into contact said third and fourth bonding surfaces; and bonding together said third substrate and said remaining portion.

14. A method as recited in claim 5, comprising:

forming a multilayer interconnect;

bonding said multilayer interconnect to said bonded pair; and interconnecting said first and second semiconductor devices using said multilayer interconnect.

15. A method as recited in claim 5, comprising:

forming one of an $SiO_2$ and diamond-like carbon film as said first and second bonding layers.

16. A method as recited in claim 5, comprising:
forming said first and second bonding layers from a material having a dielectric constant in the range of approximately 1–3 and a thermal conductivity in the range of approximately 1–10 W/cmK.

17. A method as recited in claim 5, comprising:
removing at least a substantial portion of said second substrate.

18. A method of integrating substrates, comprising:
forming a first bonding layer, having a first bonding surface, on a first surface of a first substrate, said first substrate having a first semiconductor device formed therein;
forming a second bonding layer, separated from said first bonding layer and having a second bonding surface, on a second surface of a second substrate, said second substrate having a second semiconductor device formed therein;
polishing each of said first and second bonding surfaces to a range of surface roughness;
bringing into direct contact said first and second bonding surfaces after said polishing;
bonding together said first and second substrates to form a bonded pair at about room temperature;
removing at least a portion of said second substrate by one of polishing and grinding after bonding;
interconnecting said first and second semiconductor devices after bonding said first and second substrates; and
obtaining a bond strength at about room temperature sufficient to permit said removing step.

19. A method as recited in claim 18, comprising:
after said bonding step, removing at least a portion of said second substrate from said bonded pair to form a first remaining portion, said first remaining portion containing said second semiconductor device;
forming a third bonding layer, having a third bonding surface, on a first surface of a third substrate, said third substrate having a third semiconductor device formed therein;
forming a fourth bonding layer, having a fourth bonding surface, on said first remaining portion;
polishing each of said third and fourth bonding layers to said range of surface roughness;
bringing into contact said third and fourth bonding surfaces;
bonding together said third substrate and said first remaining portion; and
interconnecting at least said second and third semiconductor devices after bonding said third substrate to said first remaining portion.

20. A method as recited in claim 19, comprising:
repeating steps of removing at least a portion of a substrate, forming a bonding layer on said portion, forming a bonding layer on a substrate, polishing bonding layers, directly contacting bonding layers, bonding substrates and interconnecting devices to produce an N-integrated device, where N is an integer greater than 3.

21. A method as recited in claim 19, comprising:
forming one of an $SiO_2$ and diamond-like carbon film as said first, second, third and fourth bonding layers.

22. A method as recited in claim 18, wherein said removing step comprises exposing a contact structure in said second semiconductor device.

23. A method as recited in claim 18, comprising:
removing substantially all of said second substrate except for a region in which said second semiconductor device is located.

24. A method as recited in claim 18, comprising:
removing said second substrate to leave an array of devices unconnected by any portion of said second substrate.

25. A method as recited in claim 18, comprising:
removing said second substrate to leave an array of devices substantially completely isolated from each other.

26. A method as recited in claim 18, comprising:
forming said first and second bonding layers from a non-adhesive material; and
bonding said first and second bonding layers without fusing.

27. A method as recited in claim 18, comprising:
forming one of an $SiO_2$ and diamond-like carbon film as said first and second bonding layers.

28. A method as recited in claim 18, comprising:
forming said first and second bonding layers from a material having a dielectric constant in the range of approximately 1–3 and a thermal conductivity in the range of approximately 1–10 W/cmK.

29. A method as recited in claim 18, comprising:
polishing each of said first and second bonding layers to a surface roughness in the range of 5–15 Å.

30. A method as recited in claim 18, comprising:
polishing each of said first and second bonding layers to a surface roughness in the range of 5–10 Å.

31. A method as recited in claim 18, comprising:
polishing each of said first and second bonding layers to a surface roughness no more than 5 Å.

32. A method as recited in claim 18, comprising:
said first and second substrates being of different technologies.

33. A method as recited in claim 18, comprising:
forming a first planarizing layer on said first substrate; and
forming said first bonding layer on said first planarizing layer.

34. A method as recited in claim 33, comprising:
forming a second planarizing layer on said second substrate; and
forming said second bonding layer on said second planarizing layer.

35. A method as recited in claim 18, wherein:
said first surface comprises a first plurality of metal structures, said method comprising forming said first bonding layer to cover said first plurality of metal structures.

36. A method as recited in claim 35, wherein:
said second surface comprises a second plurality of metal structures, said method comprising forming said second bonding layer to cover said second plurality of metal structures.

37. A method as recited in claim 18, wherein:
said first surface comprises a first material and a first plurality of metal structures extending above said first material, said method comprising forming said first bonding layer on said first plurality of metal structures and said first material.

38. A method as recited in claim 37, wherein:
said first plurality of metal structures extend above said first material by a distance, said method comprising forming said first bonding layer to a thickness no more than 10 times said distance.

39. A method as recited in claim 37, comprising:
forming said first bonding layer to substantially completely cover both said first plurality of metal structures and said first material.

40. A method as recited in claim 37, wherein:
said second surface comprises a second material and a second plurality of metal structures extending above said second material, said method comprising forming said second bonding layer on said second plurality of metal structures and said second material.

41. A method as recited in claim 40, comprising:
forming said second bonding layer to substantially completely cover both said second plurality of metal structures and said second material.

42. A method as recited in claim 18, wherein:
said first surface comprises a vertical topology corresponding to a first plurality of interconnect structures, said method comprising forming said first bonding layer on said first plurality of interconnect structures.

43. A method as recited in claim 42, comprising:
forming said first bonding layer to substantially completely cover said first plurality of interconnect structures.

44. A method as recited in claim 42, wherein:
said second surface comprises a vertical topology corresponding to a second plurality of interconnect structures, said method comprising forming said second bonding layer on said second plurality of interconnect structures.

45. A method as recited in claim 44, comprising:
forming said second bonding layer to substantially completely cover said second plurality of interconnect structures.

46. A method as recited in claim 18, comprising:
forming one of an $SiO_2$ and diamond-like carbon film as said first and second bonding layers by chemical vapor deposition.

47. A method as recited in claim 18, comprising:
forming said first and second bonding layers from a material having a dielectric constant in the range of approximately 1–3 and a thermal conductivity in the range of approximately 1–10 W/cmK.

48. A method as recited in claim 18, wherein said interconnecting comprises forming a multilayer interconnect.

49. A method as recited in claim 18, comprising:
forming a multilayer interconnect;
forming a third bonding layer on said interconnect;
polishing said third bonding layer to said range of surface roughness;
bonding said interconnect to said second substrate; and
interconnecting said interconnect and said second semiconductor device.

50. A method of integrating substrates, comprising:
fabricating a first semiconductor device on a first substrate;
fabricating a second semiconductor device on a second substrate;
depositing a first oxide bonding layer, having a first bonding surface, on a first surface of said first substrate;
polishing said first oxide layer to a surface roughness range;
polishing an upper surface of said second substrate to said range of surface roughness, said device having a deposited oxide as part of the device and said upper surface comprising a surface of said deposited oxide;
bringing into direct contact said first bonding surface and said upper surface after said polishing steps;
bonding together said first and second substrates at about room temperature to form a bonded pair;
removing at least a portion of said second substrate using at least one of polishing and grinding;
interconnecting said first and second semiconductor devices after bonding said first and second substrates; and
obtaining a bond strength at about room temperature sufficient to permit said removing step.

51. A method as recited in claim 50, comprising:
depositing a silicon oxide layer as said first oxide bonding layer; and
polishing said upper surface of said second substrate to said range of surface roughness, said device having a deposited silicon oxide as part of the device and said upper surface comprising a surface of said deposited silicon oxide.

52. A method as recited in claim 50, comprising:
after said bonding step, removing at least a portion of said second substrate from said bonded pair to form a first remaining portion, said first remaining portion containing said second semiconductor device;
forming a third bonding layer, having a third bonding surface, on a first surface of a third substrate, said third substrate having a third semiconductor device formed therein;
forming a fourth bonding layer, having a fourth bonding surface, on said first remaining portion;
polishing each of said third and fourth bonding layers to said range of surface roughness;
bringing into contact said third and fourth bonding surfaces;
bonding together said third substrate and said first remaining portion; and
interconnecting at least said second and third semiconductor devices after bonding said third substrate to said remaining portion.

53. A method as recited in claim 52, comprising:
repeating steps of removing at least a portion of a substrate, forming a bonding layer on said portion, forming a bonding layer on a substrate, polishing bonding layers, directly contacting bonding layers, bonding substrates and interconnecting devices to produce an N-integrated device, where N is an integer greater than 3.

54. A method as recited in claim 50, comprising:
polishing each of said first bonding layer and said upper surface to a surface roughness in the range of 5–15 Å.

55. A method as recited in claim 50, comprising:
polishing each of said first bonding layer and said upper surface to a surface roughness in the range of 5–15 Å.

56. A method as recited in claim 50, comprising:
polishing each of said first bonding layer and said upper surface to a surface roughness no more than 5 Å.

57. A method as recited in claim 50, wherein:
said first surface comprises a first plurality of metal structures, said method comprising forming said first bonding layer to cover said first plurality of metal structures.

58. A method as recited in claim 57, wherein:
said upper surface comprises a second plurality of metal structures, said method comprising forming said deposited oxide to cover said second plurality of metal structures.

59. A method as recited in claim 50, wherein:
said first surface comprises a first material and a first plurality of metal structures extending above said first material, said method comprising forming said first bonding layer on said first plurality of metal structures and said first material.

60. A method as recited in claim 59, wherein:
said first plurality of metal structures extend above said first material by a distance, said method comprising forming said first bonding layer to a thickness no more than 10 times said distance.

61. A method as recited in claim 59, comprising:
forming said first bonding layer to substantially completely cover both said first plurality of metal structures and said first material.

62. A method as recited in claim 59, wherein:
said upper surface comprises a second material and a second plurality of metal structures extending above said second material, said method comprising forming said deposited oxide on said second plurality of metal structures and said second material.

63. A method as recited in claim 62, comprising:
forming said deposited oxide to substantially completely cover both said second plurality of metal structures and said second material.

64. A method as recited in claim 50, wherein:
said first surface comprises a vertical topology corresponding to a first plurality of interconnect structures, said method comprising forming said first bonding layer on said first plurality of interconnect structures.

65. A method as recited in claim 64, comprising:
forming said first bonding layer to substantially completely cover said first plurality of interconnect structures.

66. A method as recited in claim 64, wherein:
said second substrate comprises a vertical topology corresponding to a second plurality of interconnect structures, said method comprising forming said deposited oxide on said second plurality of interconnect structures.

67. A method as recited in claim 66, comprising:
forming said deposited oxide to substantially completely cover said second plurality of interconnect structures.

68. A method as recited in claim 50, comprising:
said first and second substrates being of different technologies.

69. A method of integrating substrates, comprising:
fabricating a first semiconductor device in a first substrate, said first device having a plurality of first metallic contact structures;
fabricating a second semiconductor device in a second substrate, said second device having a plurality of second metallic contact structures;
depositing a first oxide bonding layer, having a first bonding surface, on a surface of said first substrate, said first oxide layer having a surface roughness in a surface roughness range;
depositing a second oxide bonding layer, having a second bonding surface, on a surface of said first substrate, said second oxide bonding layer having a surface roughness in said range of surface roughness;
bringing into direct contact said surfaces of said first and second bonding layers;
bonding together said first and second substrates to form a bonded pair at about room temperature;
removing at least of portion of said second substrate after said bonding using at least one of grinding and polishing;
interconnecting said first and second metallic contact structures after said bonding; and
obtaining a bond strength at about room temperature sufficient to permit said removing step.

70. A method as recited in claim 69, comprising:
forming a third oxide bonding layer on a surface of a third substrate, said third oxide bonding layer having a third bonding surface with a surface roughness in said range of surface roughness;
forming a fourth oxide bonding layer on a remaining portion of said second substrate, said fourth oxide bonding layer having a fourth bonding surface with a surface roughness in said range of surface roughness;
bringing into contact said third and fourth bonding surfaces;
bonding together said third substrate and said remaining portion; and
interconnecting at least said second and third semiconductor devices after bonding said third substrate to said remaining portion.

71. A method as recited in claim 70, comprising:
polishing each of said first to fourth oxide bonding layers to produce respective surface roughnesses in said surface roughness range.

72. A method as recited in claim 71, comprising:
polishing each of said first to fourth oxide bonding layers to a surface roughness in the range of 5–10 Å.

73. A method as recited in claim 71, comprising:
polishing each of said first to fourth oxide bonding layers to a surface roughness no more than 5 Å.

74. A method as recited in claim 69, comprising:
removing said second substrate to leave substantially only said second semiconductor device.

75. A method as recited in claim 1, comprising:
forming a first semiconductor device in said first workpiece;
forming a second semiconductor device in said second workpiece; and
interconnecting said first and second semiconductor devices after bonding said first and second workpieces.

76. A method as recited in claim 2, comprising:
bonding together said first and second surfaces without application of sustained pressure.

77. A method as recited in claim 5, comprising:
bonding together said first and second substrates without application of sustained pressure.

78. A method as recited in claim 18, comprising:
bonding together said first and second substrates without application of sustained pressure.

79. A method as recited in claim 50, comprising:
bonding together said first and second substrates without application of sustained pressure.

80. A method as recited in claim 69, comprising:
bonding together said first and second substrates without application of sustained pressure.

* * * * *

UNITED STATES PATENT AND TRADEMARK OFFICE
CERTIFICATE OF CORRECTION

PATENT NO. : 6,984,571 B1 Page 1 of 1
APPLICATION NO. : 09/410054
DATED : January 10, 2006
INVENTOR(S) : Paul M. Enquist It is certified that error appears in the above-identified patent and that said Letters Patent is hereby corrected as shown below:

Column 18, line 51, change "5-15 Å" to --5-10 Å--.

Signed and Sealed this

First Day of May, 2007

JON W. DUDAS
*Director of the United States Patent and Trademark Office*